United States Patent
Oh

(10) Patent No.: US 12,490,615 B2
(45) Date of Patent: Dec. 2, 2025

(54) DISPLAY DEVICE

(71) Applicant: LG DISPLAY CO., LTD., Seoul (KR)

(72) Inventor: Jaeyoung Oh, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 559 days.

(21) Appl. No.: 17/959,688

(22) Filed: Oct. 4, 2022

(65) Prior Publication Data
US 2023/0180567 A1   Jun. 8, 2023

(30) Foreign Application Priority Data

Dec. 7, 2021   (KR) .......................... 10-2021-0174200

(51) Int. Cl.
  *H10K 59/35*    (2023.01)
  *H10K 59/122*   (2023.01)
  *H10K 59/38*    (2023.01)

(52) U.S. Cl.
  CPC ......... *H10K 59/353* (2023.02); *H10K 59/122* (2023.02); *H10K 59/351* (2023.02); *H10K 59/38* (2023.02)

(58) Field of Classification Search
  CPC .. H10K 59/353; H10K 59/122; H10K 59/351; H10K 59/38; H10K 59/124; H10K 59/873; H10K 50/86
  See application file for complete search history.

(56) References Cited

U.S. PATENT DOCUMENTS

| | | | |
|---|---|---|---|
| 9,165,994 B1 | 10/2015 | Yang et al. | |
| 2011/0232749 A1* | 9/2011 | Lienhart | H10F 19/30 |
| | | | 204/192.12 |
| 2015/0090985 A1* | 4/2015 | Park | H10K 59/38 |
| | | | 257/40 |
| 2017/0194385 A1* | 7/2017 | Jung | H10K 59/30 |
| 2020/0194522 A1* | 6/2020 | Lee | H10K 71/12 |
| 2021/0151709 A1* | 5/2021 | Yoneda | H10K 71/00 |
| 2021/0202877 A1* | 7/2021 | Mishima | H10K 50/15 |

FOREIGN PATENT DOCUMENTS

KR    20150112101 A    10/2015

* cited by examiner

*Primary Examiner* — S M Sohel Imtiaz
(74) *Attorney, Agent, or Firm* — Morgan, Lewis & Bockius LLP

(57) ABSTRACT

Disclosed is a display device including a substrate including a plurality of sub-pixels, each light-emitting area included in each of the sub-pixels, a buffer layer positioned on the substrate and including each buffer hole defined therein for exposing a surface of the substrate in each light-emitting area, and a bank positioned on the buffer layer and having each bank hole defined therein for separating the light-emitting area of each sub-pixel from the light-emitting areas of other sub-pixels.

14 Claims, 28 Drawing Sheets

DISPLAY DEVICE

CROSS-REFERENCE TO RELATED APPLICATION

This application claims priority from Korean Patent Application No. 10-2021-0174200 filed on Dec. 7, 2021 in the Korean Intellectual Property Office, and all the benefits accruing therefrom under 35 U.S.C. 119, the contents of which in its entirety are herein incorporated by reference.

BACKGROUND

Technical Field

The present disclosure relates to a display device for reducing a reflectance.

Discussion of the Related Art

Display devices are being applied to various electronic devices such as TVs, mobile phones, laptops, and tablets. To this end, research to develop thinner, lighter, and lower power consuming display devices, etc. is continuing.

The display device may include a liquid crystal display device (LCD), a plasma display panel device (PDP), a field emission display device (FED), an electro-wetting display device (EWD), an organic light-emitting display device (OLED), and the like.

Among those, the organic light-emitting display device (OLED) includes a plurality of pixel areas disposed in a display area in which an image is displayed and a plurality of organic light-emitting elements corresponding to the plurality of pixel areas. Because the organic light-emitting element is self-emissive that emits light by itself, the organic light-emitting display device may have faster response speed, greater luminous efficiency, luminance and viewing angle, and excellent contrast ratio and color gamut compared to other display devices.

In a display device equipped with such an organic light-emitting element, as an importance of a configuration that lowers a reflectance for external light to increase a transmittance and also improves a light-emitting efficiency increases, research on such configuration is continuously being conducted.

SUMMARY

Accordingly, embodiments of the present disclosure are directed to a display device that substantially obviates one or more of the problems due to limitations and disadvantages of the related art.

An aspect of the present disclosure is to provide a display device for reducing a reflectance.

Another aspect of the present disclosure is to provide a display device that removes buffer layers in a light-emitting area to increase a transmittance to increase a luminance and reduce a reflectance.

Another aspect of the present disclosure is to increase a light-emitting efficiency of an organic light-emitting element as a polarizer may be omitted in a display device because a reflectance may be reduced by removing buffer layers.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, a display device comprises a substrate including a plurality of sub-pixels, each light-emitting area included in each of the sub-pixels, a buffer layer positioned on the substrate and including each buffer hole defined therein for exposing a surface of the substrate in each light-emitting area, and a bank positioned on the buffer layer and having each bank hole defined therein for separating the light-emitting area of each sub-pixel from the light-emitting areas of other sub-pixels.

In another aspect, a display device comprises a substrate including a plurality of sub-pixels, a buffer layer positioned on the substrate, each buffer hole defined to extend through the buffer layer so as to expose the substrate, an interlayer insulating film for covering the substrate exposed by each buffer hole, a color filter positioned on the interlayer insulating film and filling each buffer hole, a planarization film positioned on the color filter, a first electrode positioned on the planarization film, and a bank positioned on the first electrode and having each bank hole defined therein for separating a light-emitting area of one sub-pixel from light-emitting areas of other sub-pixels.

According to embodiments of the present disclosure, as the buffer hole exposing the transparent substrate is defined by removing the buffer layers in the light-emitting area of the display device, the transmittance may be increased to increase the luminance.

Further, the buffer layers may be removed in the light-emitting area of the display device to reduce the reflectance affected by the refractive index of the buffer layer, thereby reducing the reflectance of the entire display device.

Further, the buffer hole may be defined to have the size equal to or smaller than the size of the bank hole to form the end of the buffer layer larger than the end of the bank, so that the path through which the light travels along the interface between the buffer layers may be increased to extinguish the external light inside the buffer layer. Accordingly, the reliability of the display device may be improved by preventing the inflow of the external light to the transistor to reduce the negative bias stress of the transistor.

Further, because the reflectance may be reduced by removing the buffer layers, the polarizer that is introduced to reduce the reflectance may be omitted in the display device, thereby preventing the light-emitting efficiency from being lowered by the polarizer.

As the lowering of the light-emitting efficiency by the polarizer is prevented, the phenomenon in which the lifespan of the organic light-emitting element is reduced and thus the reliability of the display device is lowered may be prevented.

In addition, as the buffer layers are selectively removed depending on the pixel area, the viewing angle non-uniformity may be prevented from occurring.

It is to be understood that both the foregoing general description and the following detailed description are exemplary and explanatory and are intended to provide further explanation of the inventive concepts as claimed.

BRIEF DESCRIPTION OF DRAWINGS

The accompanying drawings, which are included to provide a further understanding of the disclosure and are incorporated in and constitute a part of this application, illustrate embodiments of the disclosure and together with the description serve to explain various principles.

DETAILED DESCRIPTIONS

Figure 1:
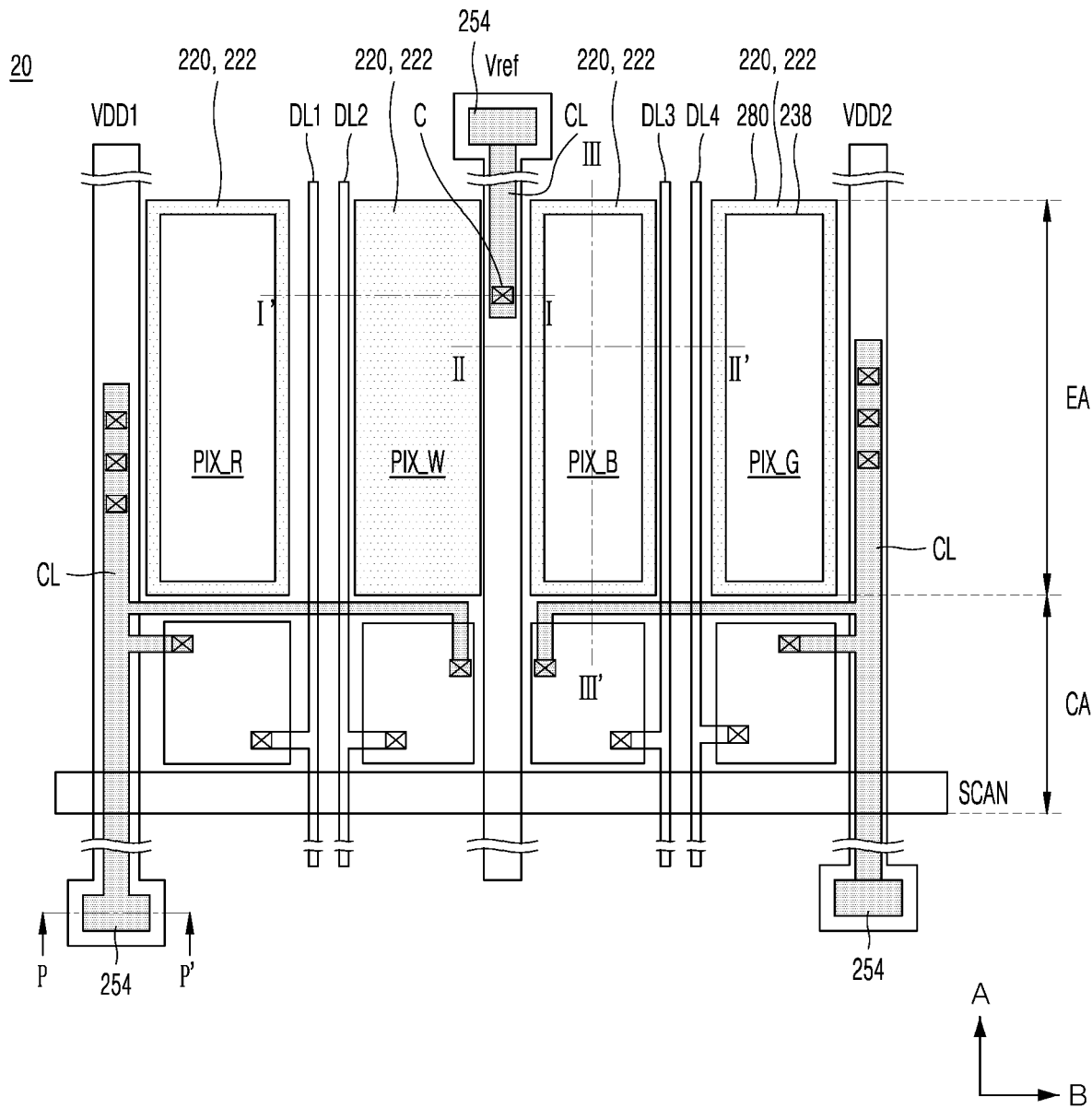
FIG. 1 is a schematic plan view of a display device according to one embodiment of the present disclosure.

Advantages and features of the present disclosure, and a method of achieving the advantages and features will become apparent with reference to embodiments described later in detail together with the accompanying drawings. However, the present disclosure is not limited to the embodiments as disclosed below, but may be implemented in various different forms. Thus, these embodiments are set forth only to make the present disclosure complete, and to completely inform the scope of the present disclosure to those of ordinary skill in the technical field to which the present disclosure belongs, and the present disclosure is only defined by the scope of the claims.

A shape, a size, a ratio, an angle, a number, etc. disclosed in the drawings for describing the embodiments of the present disclosure are exemplary, and the present disclosure is not limited thereto. The same reference numerals refer to the same elements herein. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

The terminology used herein is directed to the purpose of describing particular embodiments only and is not intended to be limiting of the present disclosure. As used herein, the singular constitutes "a" and "an" are intended to include the plural constitutes as well, unless the context clearly indicates otherwise. It will be further understood that the terms "comprise", "including", "include", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list. In interpretation of numerical values, an error or tolerance therein may occur even when there is no explicit description thereof.

In addition, it will also be understood that when a first element or layer is referred to as being present "on" a second element or layer, the first element may be disposed directly on the second element or may be disposed indirectly on the second element with a third element or layer being disposed between the first and second elements or layers. It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like is disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

In descriptions of temporal relationships, for example, temporal precedent relationships between two events such as "after", "subsequent to", "before", etc., another event may occur therebetween unless "directly after", "directly subsequent" or "directly before" is not indicated.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

The features of the various embodiments of the present disclosure may be partially or entirely combined with each other, and may be technically associated with each other or operate with each other. The embodiments may be implemented independently of each other and may be implemented together in an association relationship.

In interpreting a numerical value, the value is interpreted as including an error range unless there is no separate explicit description thereof.

It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

The features of the various embodiments of the present disclosure may be partially or entirely combined with each other, and may be technically associated with each other or operate with each other. The embodiments may be implemented independently of each other and may be implemented together in an association relationship.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a display device according to an embodiment of the present disclosure will be described with reference to the accompanying drawings.

Figure 2A:
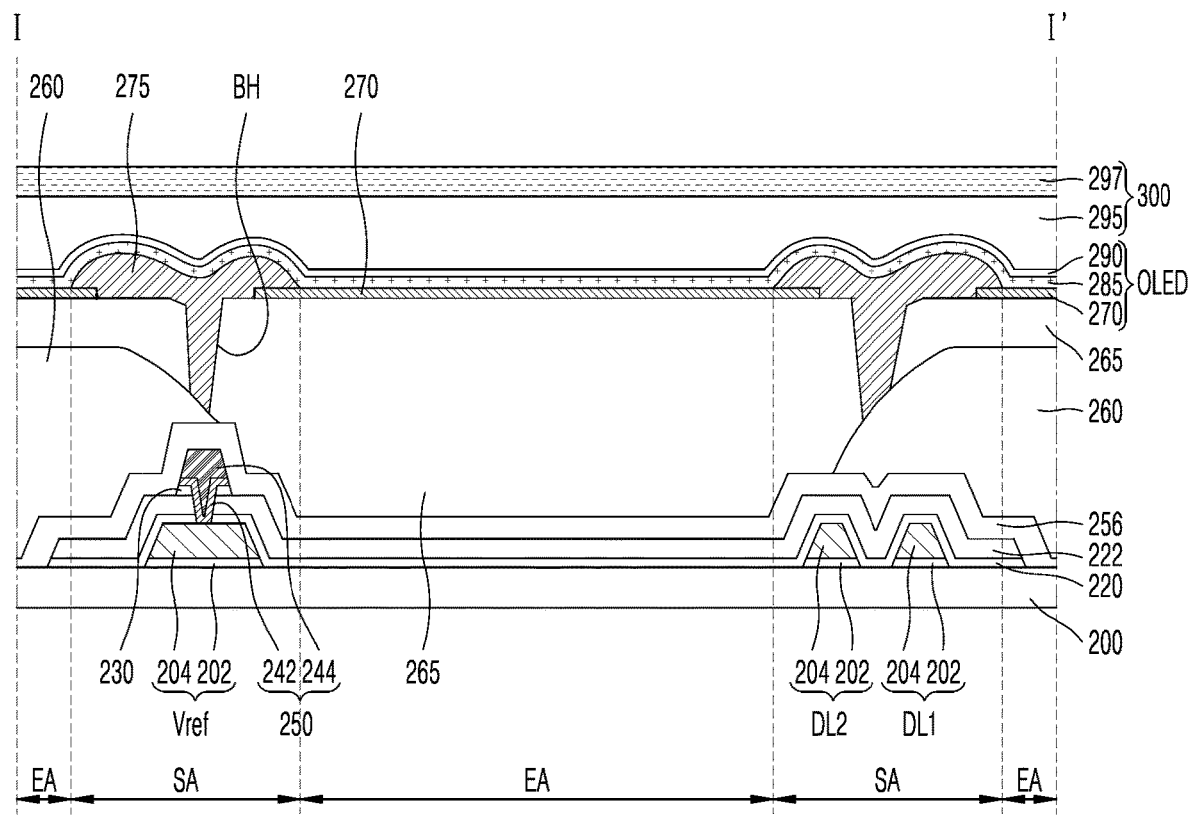
FIGS. 2A to 2C are cross-sectional views of FIG. 1 cut along I-r, II-Ir, and III-III' directions.
Figure 2B:
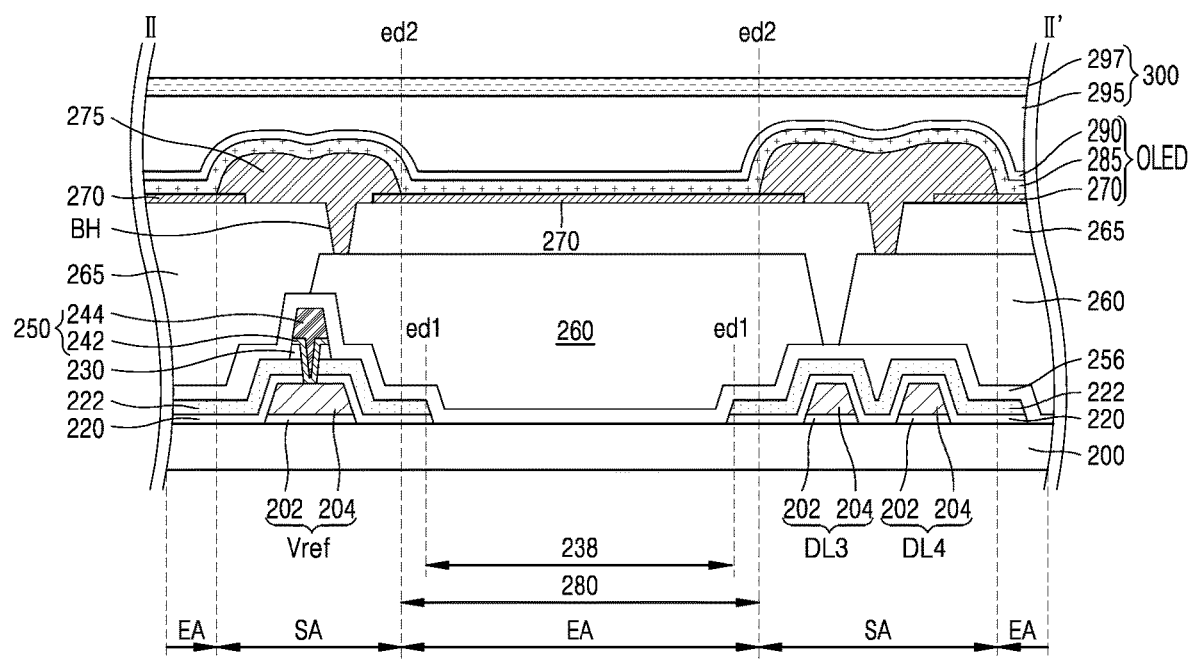
Figure 2C:
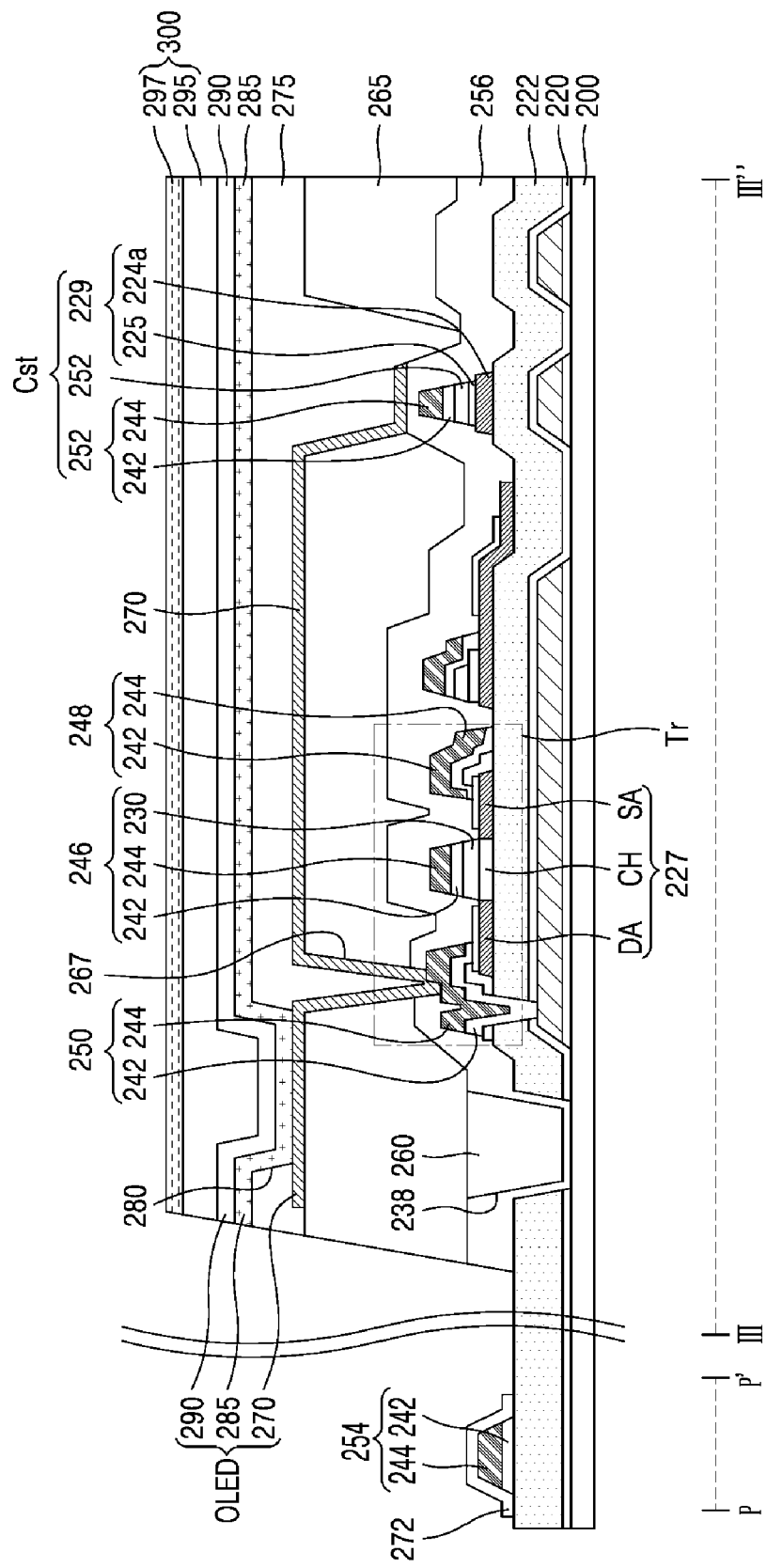
Figure 3:
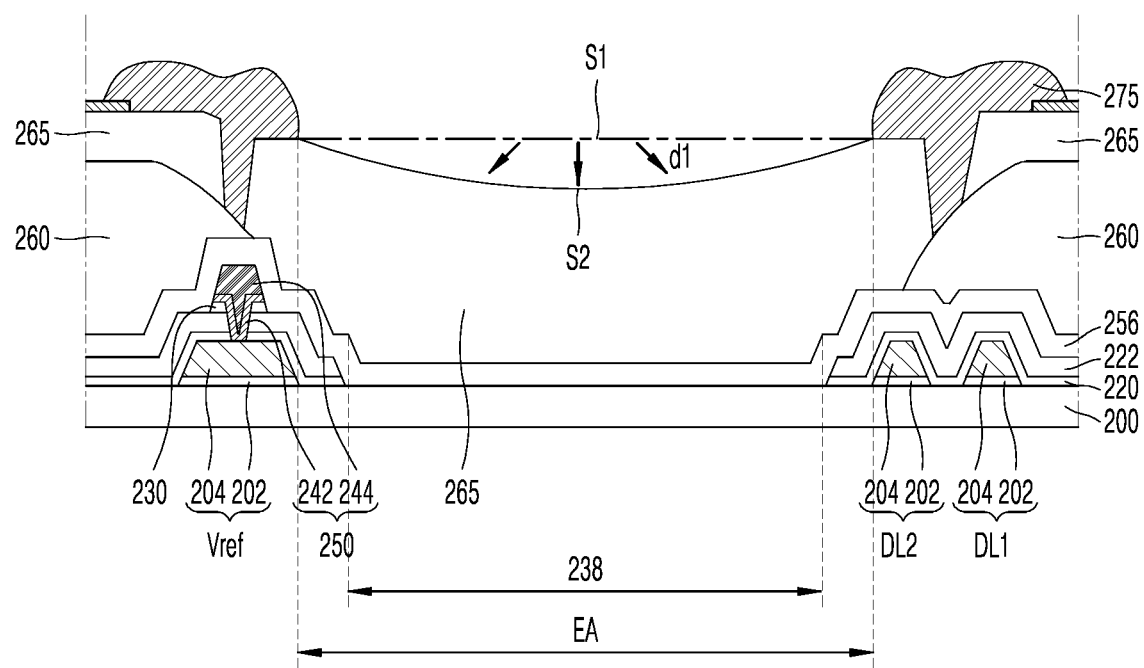
FIG. 3 is a cross-sectional view for illustrating a white pixel in which a buffer hole is defined.

FIG. 1 is a schematic plan view of a display device according to one embodiment of the present disclosure. FIGS. 2A to 2C are cross-sectional views of FIG. 1 cut along I-I', II-II', and III-III' directions. In addition, FIG. 3 is a cross-sectional view for illustrating a white pixel in which a buffer hole is defined.

Referring to FIG. 1 to FIG. 2C, a display device 20 includes a light-emitting area EA in which an organic light-emitting element (OLED) emitting light is disposed, and a circuit area CA with driving circuit elements for supplying a driving current to the organic light-emitting element (OLED). The light-emitting area EA and the circuit area CA are arranged in a display area in which a plurality of sub-pixels PIX_R, PIX_W, PIX_B, and PIX_G are arranged. In the embodiment of the present disclosure, only some PIX_R, PIX_W, PIX_B, and PIX_G of the sub-pixels are shown, but the sub-pixels may be arranged in a matrix form (M*N, M and N are natural numbers) on the display area.

Each of the sub-pixels PIX_R, PIX_W, PIX_B, and PIX_G arranged in the display area includes the driving circuit element disposed in the circuit area CA and the organic light-emitting element (OLED) disposed in the light-emitting area EA. In the circuit area CA, the driving circuit elements for supplying the driving current to the organic light-emitting element (OLED) are arranged. The driving circuit elements may include a thin-film transistor T and a storage capacitor Cst.

A plurality of line electrodes may be disposed on the display device 20. The line electrodes for supplying power and signals to the driving circuit elements and the organic light-emitting element (OLED) may be arranged in a first direction A of the display device 20 and a second direction B, which is a direction intersecting with the first direction A. In this regard, the line electrodes include driving power supply lines VDD1 and VDD2, data lines DL1, DL2, DL3, and DL4, a reference power supply line Vref, and a scan line SCAN. Among them, the driving power supply lines VDD1 and VDD2, the data lines DL1, DL2, DL3, and DL4, and the reference power supply line Vref may be arranged in the first direction A of the display device 20, and the scan line SCAN may be disposed in the second direction B. In this regard, the first direction A may be a vertical line, and the second direction B may be a horizontal line. In the present disclosure, the first direction A is the vertical line and the second direction B is the horizontal line for the description of the embodiment, but the present disclosure is not limited thereto. In another example, the first direction A may be the horizontal line and the second direction B may be the vertical line.

The driving power supply lines VDD1 and VDD2, the reference power supply line Vref, the data lines DL1, DL2, DL3, and DL4, and the scan line SCAN may have a structure in which at least one of a first metal layer 202 and a second metal layer 204 is disposed on a substrate 200 or two layers are stacked. Each of the first metal layer 202 and the second metal layer 204 contains an opaque metal material. For example, the first metal layer 202 may contain copper (Cu), and the second metal layer 205 may contain a titanium molybdenum alloy (MoTi). As each of the first metal layer 202 and the second metal layer 204 contains the opaque metal material, an area in which the driving power supply lines VDD1 and VDD2, the reference power supply line Vref, the data lines DL1, DL2, DL3, and DL4, and the scan line SCAN are arranged may be understood as a light-shielding area.

The sub-pixels PIX_R, PIX_W, PIX_B, and PIX_G may be separated from each other by the driving power supply lines VDD1 and VDD2, the data lines DL1, DL2, DL3, and DL4, and the reference power supply line Vref arranged in the first direction A, and the scan line SCAN arranged in the second direction B.

A pad electrode 254 is disposed on a non-display area excluding the display area, and supplies a driving signal to each of a gate electrode 246, the data lines DL1, DL2, DL3, and DL4, the driving power supply lines VDD1 and VDD2, and the reference power supply line Vref. In an embodiment of the present disclosure, a configuration in which the pad electrode 254 is connected to the driving power supply lines VDD1 and VDD2 and the reference power supply line Vref is presented as an embodiment, but the present disclosure is not limited thereto. For example, a plurality of pad electrodes 254 may be connected to each of the data lines DL1, DL2, DL3, and DL4 and the scan line SCAN.

The pad electrode 254 may be made of the same material as that of the gate electrode 246 and may be disposed on the same plane as the gate electrode 246. In an example, the pad electrode 254 may be formed in a structure in which a first gate metal layer 242 and a second gate metal layer 244 are stacked. The first gate metal layer 242 or the second gate metal layer 244 may have a single layer or multiple layers made of one selected from a group consisting of molybdenum (Mo), aluminum (Al), chromium (Cr), gold (Au), titanium (Ti), nickel (Ni), neodymium (Nd), and copper (Cu) or an alloy thereof, but the present disclosure may not be limited thereto.

In one example, the pad electrode 254 may include each connection line CL extending from the pad electrode 254 and formed in a line shape extending along the first direction A of the display device 20 by at least partially overlapping each of the driving power supply lines VDD1 and VDD2 or the reference power supply line Vref. The connection line CL may be made of the same material as that of the gate electrode 246.

As described above, the plurality of sub-pixels PIX_R, PIX_W, PIX_B, and PIX_G are arranged in the matrix form in the first direction A and the second direction B. Accordingly, a plurality of connection lines CL extending from the pad electrodes 254 to connect the driving power supply lines VDD1 and VDD2 and the reference power supply line Vref to the sub-pixels may be included.

The sub-pixels PIX_R, PIX_W, PIX_B, and PIX_G include areas in which a red pixel PIX_R, a blue pixel PIX_B, and a green pixel PIX_G are respectively formed, and an area in which a white pixel PIX_W is formed. In (b) in FIG. 2, an area in which the blue pixel PIX_B is formed is illustrated as an embodiment, but areas in which the red pixel PIX_R and the green pixel PIX_G are respectively formed also have the same components as those in the area in which the blue pixel PIX_B is formed.

Referring back to FIG. 1 to FIG. 2C, the line electrodes including the reference power supply line Vref and the data lines DL1 and DL2 are disposed on the substrate 200. The area in which the line electrode is disposed may be formed as the light-shielding area SA.

The reference power supply line Vref and the data lines DL1 and DL2 are covered with buffer layers 220 and 222. The buffer layers 220 and 222 are formed in a structure in which a first buffer layer 220 having a first thickness and a second buffer layer 222 having a second thickness relatively greater than the first thickness are stacked. Each of the first buffer layer 220 and the second buffer layer 222 may contain an inorganic insulating material such as a silicon oxide (SiOx) or a silicon nitride (SiNx).

The buffer layers 220 and 222 are disposed to extend throughout the light-shielding area SA on the substrate 200 while covering the reference power supply line Vref and the data lines DL1 and DL2. The buffer layers 220 and 222 include a buffer hole 238 defined therein for exposing a surface of the substrate 200 in the light-emitting area EA of each of the red pixel PIX_R, the blue pixel PIX_B, and the green pixel PIX_G excluding the light-emitting area EA of the white pixel PIX_W.

A contact hole C for electrically connecting the connection line CL extended from the pad electrode 254 and the reference power supply line Vref to each other is defined in the buffer layers 220 and 222. For reference, a component indicated by a reference numeral 'C' throughout the drawings refers to a contact hole defined to extend through an insulating layer to electrically connect two components disposed on and beneath the insulating layer such as the buffer layers 220 and 222 interposed therebetween with each other.

An interlayer insulating film 256 is disposed on the buffer layers 220 and 222 and the line electrodes including the reference power supply line Vref and the data lines DL1, DL2, DL3, and DL4.

The interlayer insulating film 256 may be formed to have a thickness to cover all of the line electrodes including the reference power supply line Vref and the data lines DL1, DL2, DL3, and DL4, and may be made of a transparent inorganic material such as a silicon nitride (SiNx), a silicon oxide (SiOx), and the like.

As shown in (b) in FIG. 2, the interlayer insulating film 256 is formed along an exposed face of the buffer hole 238 in the light-emitting area EA of each of the red pixel PIX_R, the blue pixel PIX_B, and the green pixel PIX_G, so that the interlayer insulating film 256 is formed to be in contact with a surface of the substrate 200. Further, referring to FIG. 2A, as the light-emitting area EA of the white pixel PIX_W is covered with the buffer layers 220 and 222, the interlayer insulating film 256 is formed to be in contact with surfaces of the buffer layers 220 and 222.

A color filter 260 is disposed on the interlayer insulating film 256. The color filter 260 has a sufficient thickness to fill the light-emitting area EA exposed by the buffer hole 238. Referring to FIG. 2B, the buffer hole 238 of each of the red pixel PIX_R, the blue pixel PIX_B, and the green pixel PIX_G may constitute the color filter 260 by applying each of pigments of red (R), green (G), and blue (B). Referring to (a) in FIG. 2, a surface of the interlayer insulating film 256 is exposed as the pigment is not applied to the white pixel PIX_W.

A planarization film 265 is disposed on the interlayer insulating film 256 on which the color filter 260 is disposed. The planarization film 265 may have a sufficient thickness to planarize a surface of the substrate 200 while serving to protect the elements below. The planarization film 265 contains a transparent organic insulating material such as an acrylic resin. The planarization film 265 may be formed so as to fill and cover an entirety of the buffer holes 238 in the area of the white pixel PIX_W in FIG. 2A.

The planarization film 265 may include a boundary hole BH at a boundary for separating one sub-pixel and an adjacent sub-pixel from each other. The boundary hole BH serves to prevent light leakage from one sub-pixel to another adjacent sub-pixel.

In one example, as described above, the buffer layers 220 and 222 include the buffer hole 238 for exposing the surface of the substrate 200 in the light-emitting area EA of each of the red pixel PIX_R, the blue pixel PIX_B, and the green pixel PIX_G. In the white pixel PIX_W, the buffer layers 220 and 222 cover the light-emitting area EA. When the buffer layers 220 and 222 are removed to define the buffer hole 238 in the white pixel PIX_W, there is little effect of increasing a luminance or reducing a reflectance, but a problem of non-uniformity of a viewing angle may occur, so that it is preferable to leave the buffer layers 220 and 222 in the light-emitting area EA without defining the buffer hole 238.

Specifically, referring to FIG. 3, when the planarization film 265 is formed in a state in which the buffer hole 238 is defined by removing the buffer layers 220 and 222 in the light-emitting area EA of the white pixel PIX_W, unlike in the areas of the red pixel PIX_R, the blue pixel PIX_B, and the green pixel PIX_G, the planarization film 265 is formed in a state in which the buffer hole 238 is empty.

When the planarization film 265 is formed in the state in which the buffer hole 238 is empty, a surface S2 thereof is lowered and sinks by a predefined depth dl from a position S1 of the surface, which is a position at which the surface S2 is to be realized, due to a planarization rate of the planarization film 265, so that the planarization film 265 has the surface disposed at a vertical level lower than that of a surface of the planarization film 265 in the area of sub-pixels of other colors. Therefore, it becomes difficult to implement the display area where an image is displayed on the display device 20 as a flat surface. Then, the viewing angle of the display device becomes non-uniform, so that a desired color may not appear, or a defect in which the image appears differently from an image viewed from the front may occur. Accordingly, in the white pixel PIX_W, it is preferable to leave the buffer layers 220 and 222 on the light-emitting area EA without defining the buffer hole 238.

A first electrode 270 is disposed on the planarization film 265. The first electrode 270 may be made of a transparent metal oxide such as an indium-tin-oxide (ITO) or an indium-zinc-oxide (IZO). The first electrode 270 may also be referred to as an anode electrode or a pixel electrode.

A bank 275 having a bank hole 280 defined therein is disposed on the first electrode 270. The bank 275 as a boundary area for defining the light-emitting area EA of the area in which the pixel is to be formed serves to separate the sub-pixels PIX_R, PIX_W, PIX_B, and PIX_G from each other. Further, the bank 275 serves as a barrier that prevents light of different colors of adjacent sub-pixels from being mixed with each other and output.

It is preferable that a size of the buffer hole 238 according to an embodiment of the present disclosure is at least equal to or smaller than a size of the bank hole 280. In other words, in a cross-sectional view, as shown in FIG. 2B, it is preferable that an end ed1 of the buffer layers 220 and 222 may have a size at least equal to a size of an end ed2 of the bank 275 or may further extends than the end ed2 of the bank 275 to have a size greater than that of the end ed2 of the bank 275. Accordingly, an edge of the buffer layers 220 and 222 including the buffer hole 238 defined therein has a size at least equal to a size of an edge of the bank 275 including the buffer hole 280 defined therein, or further extends than the edge of the bank 275 to have a size greater than that of the edge of the bank 275. In this regard, the buffer hole 238 may have a rectangular shape surrounding four sides of each of the sub-pixels PIX_R, PIX_W, PIX_B, and PIX_G as shown in FIG. 3, but the present disclosure may not be limited thereto.

Figure 4:
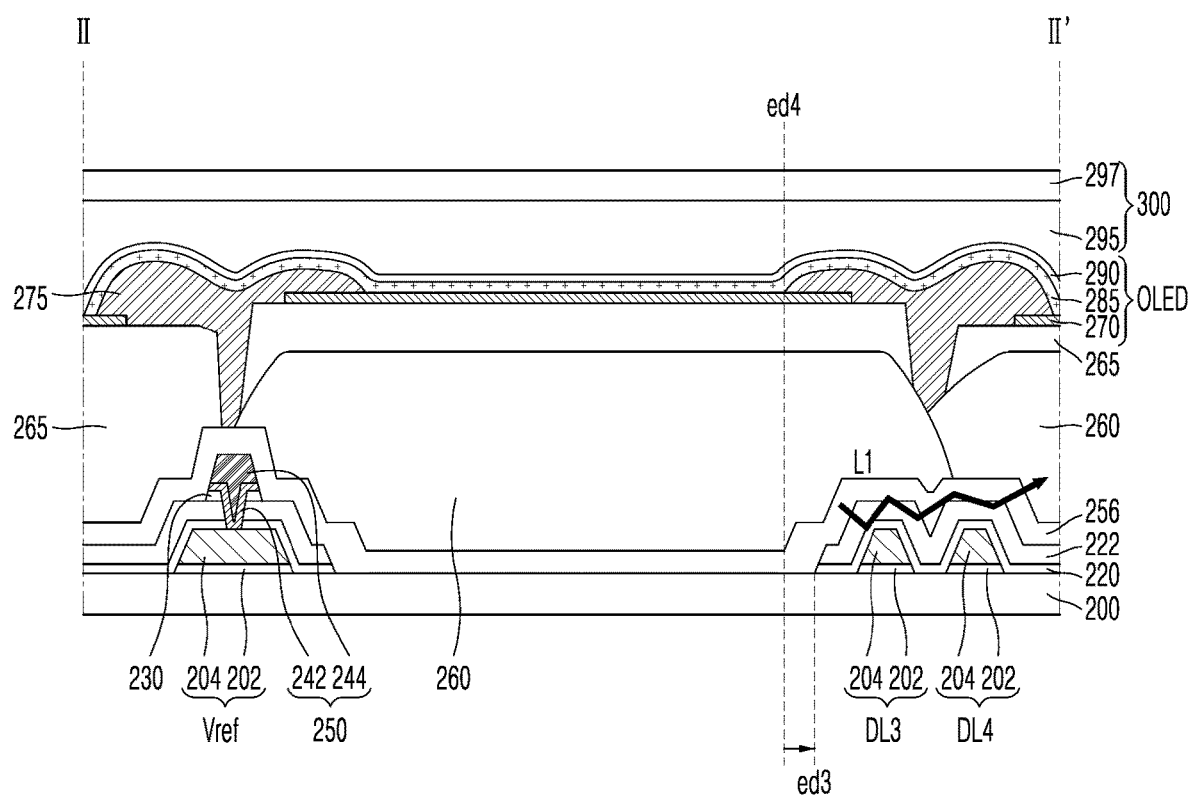
FIGS. 4 to 6 are diagrams for illustrating a problem that appears when an end of a buffer layer is formed smaller than an end of a bank.
Figure 5:
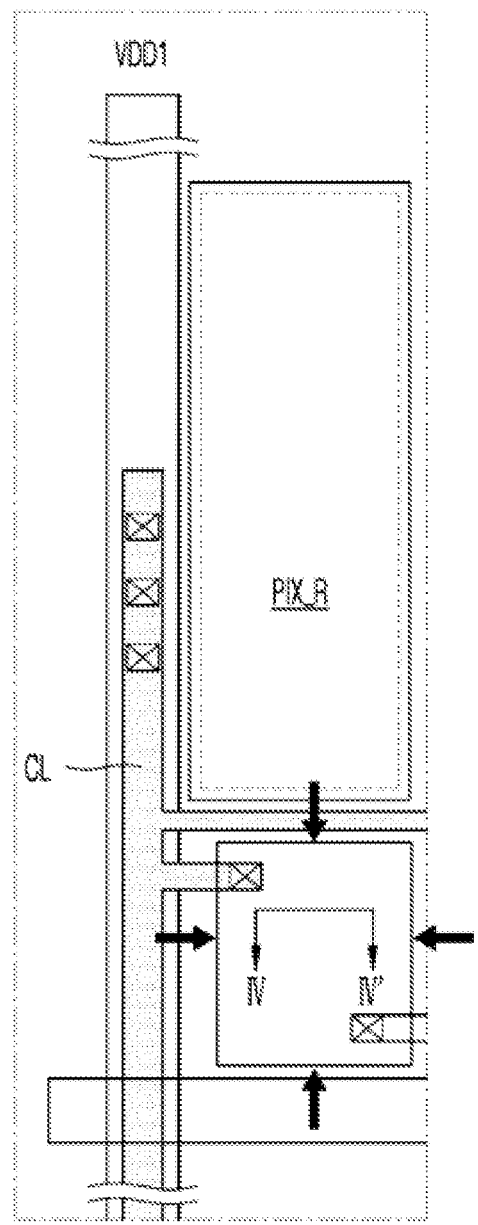
Figure 6:
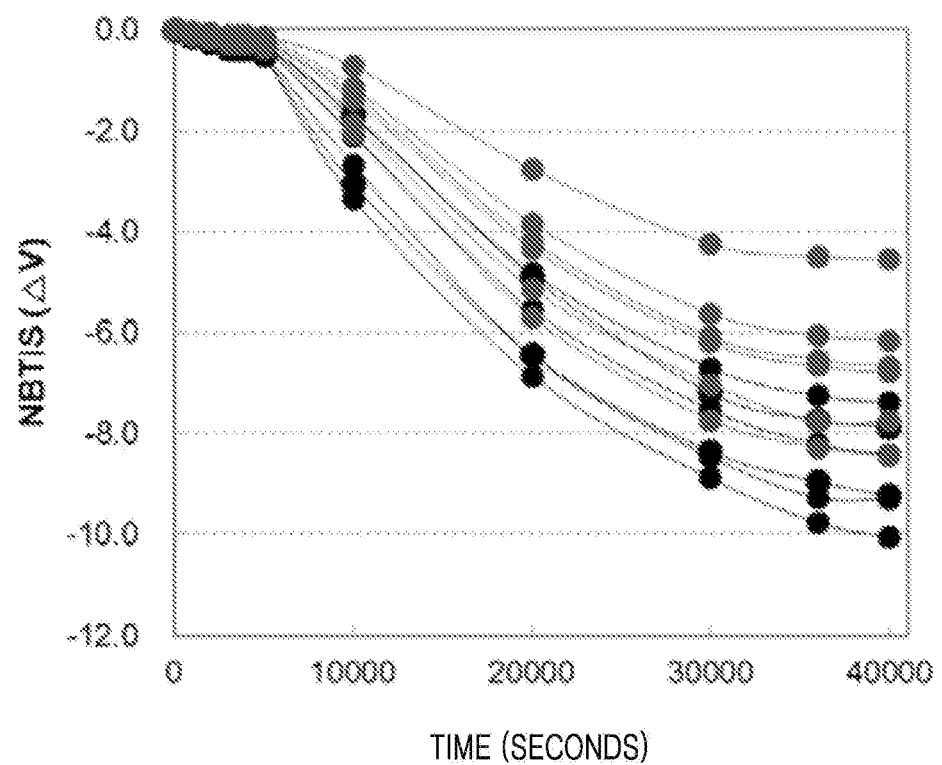

FIGS. 4 to 6 are diagrams for illustrating a problem that appears when an end of a buffer layer is formed smaller than an end of a bank. In this regard, FIG. 4 is a diagram for illustrating a path of light, and FIG. 5 is a plan view schematically showing a portion of a sub-pixel where the end of the buffer layer is formed smaller than the end of the bank. In addition, FIG. 6 is a graph showing NBTiS characteristics when light is introduced into a transistor.

Referring to FIG. 4, when the end ed3 of the buffer layers 220 and 222 is formed smaller than the end ed4 of the bank 275, a distance between etched cross-sections of the buffer layers 220 and 222 and the data line DL3 containing the metal material is relatively smaller than that in the case in which the end ed1 of the buffer layers 220 and 222 is larger than the end ed2 of the bank 275. Then, a path through which light may travel is also shortened. When the path through which the light may travel is shortened, light L1 introduced from the outside or emitted from the organic light-emitting element (OLED) may propagate along an interface between the buffer layers 220 and 222 and be more easily introduced in a direction in which a transistor is disposed as shown by an arrow in FIG. 6.

In addition, as the light is introduced in the direction in which the transistor is disposed by increasing reflection on the metal material by a refractive index of the first buffer layer 220 containing the silicon nitride (SiNx) among the buffer layers 220 and 222, the light easily reaches an active layer of the transistor.

Referring to FIG. 5, when the size of the buffer hole 238 is greater than the size of the bank hole 280, as described above, the light propagates to the interface between the buffer layers 220 and 222 by the shortened light travel path and the light propagates by being refracted by the refractive index of the first buffer layer 220, so that the light is introduced in directions of four sides of the circuit area CA as indicated by arrows. The light L1 introduced in the directions of the four sides of the circuit area CA may be introduced and reflected in a direction of a side face of the light-blocking layer 205 containing the metal material to easily reach the active layer, or may be reflected by source/drain electrodes to easily reach the active layer.

As shown in FIG. 6, the light L1 that has reached the active layer of the transistor may increase a negative bias stress of the transistor, thereby degrading NBTiS characteristics. When the NBTiS characteristics are degraded, reliability of the display device is deteriorated as a threshold voltage continues to move in a negative direction.

Accordingly, in order to reduce an interfacial effect via the cross-sections of the etched buffer layers 220 and 222, the end ed1 of the buffer layers 220 and 222 is formed larger than the end ed2 of the bank 275.

When the end ed1 of the buffer layers 220 and 222 is formed larger than the end ed2 of the bank 275, as the distance between the etched cross-sections of buffer layers 220 and 222 and the data line DL3 containing the metal material increases, the path through which the light may travel is also lengthened. When the light travel path is lengthened, as an intensity of the light traveling in the buffer layers 220 and 222 while repeating the refraction is weakened and the light is eventually extinguished, the external light may be prevented from flowing into the transistor.

In other words, as the buffer hole 238 is defined to have the size at least the equal to or smaller than the size of the bank hole 280, the path along which the light travels along the interface between the cross-sections of the etched buffer layers 220 and 222 may be increased to extinguish the external light inside the buffer layers 220 and 222. Accordingly, the negative bias stress (NBTiS) of the transistor may be prevented by preventing the inflow of the external light into the transistor. When the negative bias stress (NBTiS) of the transistor is reduced, the threshold voltage may be prevented from continuously moving in the negative direction, thereby improving the reliability of the display device.

An organic light-emitting layer 285 and a second electrode 290 are formed on the light-emitting area defined by the bank hole defined in the bank 275. Accordingly, an organic light-emitting element (OLED) composed of the first electrode 270, the organic light-emitting layer 285, and the second electrode 290 may be constructed. The organic light-emitting layer 285 is formed to be in direct contact with the first electrode 270 exposed by the bank hole 280. In one example, the organic light-emitting layer 285 may be formed to extend on a top face of the bank 275 along an exposed face of the first electrode 270. In an example, the organic light-emitting layer 285 may be made of an organic material emitting white light, and may exhibit the color set by the color filter 260.

The second electrode 290 may be formed to cover an entirety of an exposed face of the organic light-emitting layer 285. The second electrode 290 may be referred to as a cathode electrode. In an example, the second electrode 290 may contain the transparent metal oxide such as the indium-tin-oxide (ITO) or the indium-zinc-oxide (IZO).

A protective layer 300 is disposed on the second electrode 290. The protective layer 300 may include a barrier layer 295 and an anti-reflection film 297 for preventing moisture or oxygen from penetrating into the organic light-emitting layer 285. The barrier layer 295 may be made of a material having low moisture permeability, such as a polymer material, and the anti-reflection film 297 may include an acrylic film.

The display device generally includes a polarizer in the protective layer. The polarizer is introduced to increase a transmittance by lowering the reflectance for the external light. However, the polarizer also filters the light emitted from the organic light-emitting element (OLED). In one example, the polarizer filters out about 40 to 50% of the light emitted from the organic light-emitting element. Accordingly, it is necessary to supply a lot of current to the organic light-emitting element to realize the image of the desired brightness, so that the light-emitting efficiency of the display device is lowered. Further, because a lot of current must be supplied, power consumption may increase and a lifespan of the organic light-emitting element may decrease, so that the reliability of the display device may be reduced. In this regard, one embodiment of the present disclosure introduces the configuration in which the buffer layers are removed in the light-emitting area EA of each of the sub-pixels PIX_R, PIX_B, and PIX_G excluding that of the white pixel PIX_W. When the buffer layers are removed in the light-emitting area EA, the reflectance for the external light may be lowered, and thus the polarizer may be omitted from the protective layer. Accordingly, the protective layer 300 may be composed of a double structure of the barrier layer 295 and the anti-reflection film 297.

In one example, in FIG. 1, the bank hole 280, the buffer hole 238, and the buffer layers 220 and 222 are exposed for convenience of illustration, and components such as the first electrode 270, the organic light-emitting layer 285, the second electrode 290, the protective layer 300, and the like are omitted.

As described above, the display device 20 according to an embodiment of the present disclosure is constructed such that the buffer hole 238 that exposes the surface of the substrate 200 is defined in the light-emitting area EA of each of the red pixel PIX_R, the blue pixel PIX_B, and the green pixel PIX_G, and the buffer layers 220 and 222 remain in the light-emitting area EA of the white pixel PIX_W, thereby reducing the reflectance while increasing the transmittance.

Specifically, a description will be made with reference to FIGS. 7 to 10, which are graphs respectively showing measured transmittance, viewing angle, reflectance, and power consumption of each sub-pixel of the display device 20 according to an embodiment of the present disclosure and a display device according to Comparative Example.

Figure 7:
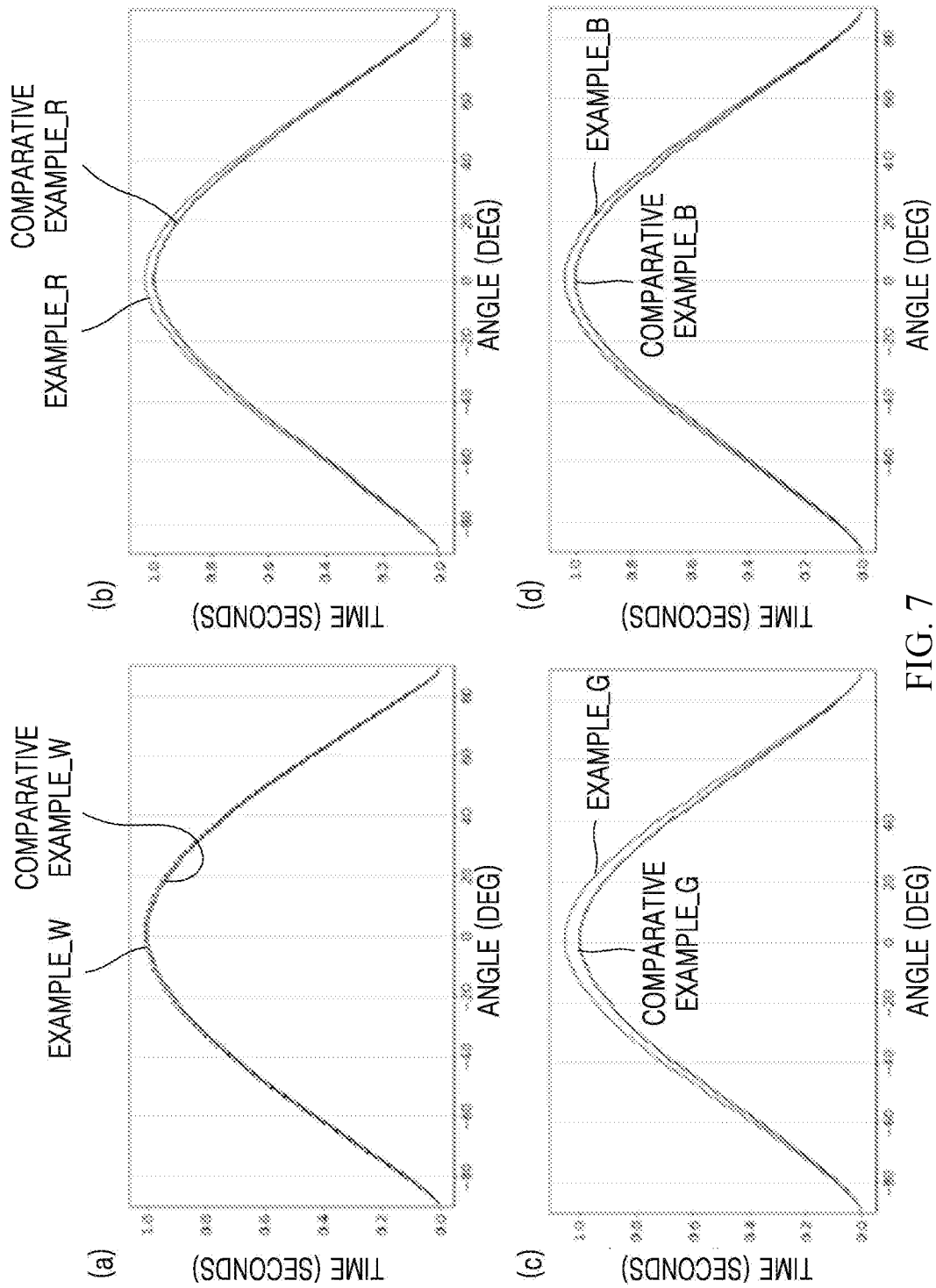
FIG. 7 is a graph showing a transmittance of each sub-pixel according to Example and Comparative Example of the present disclosure.
Figure 8:
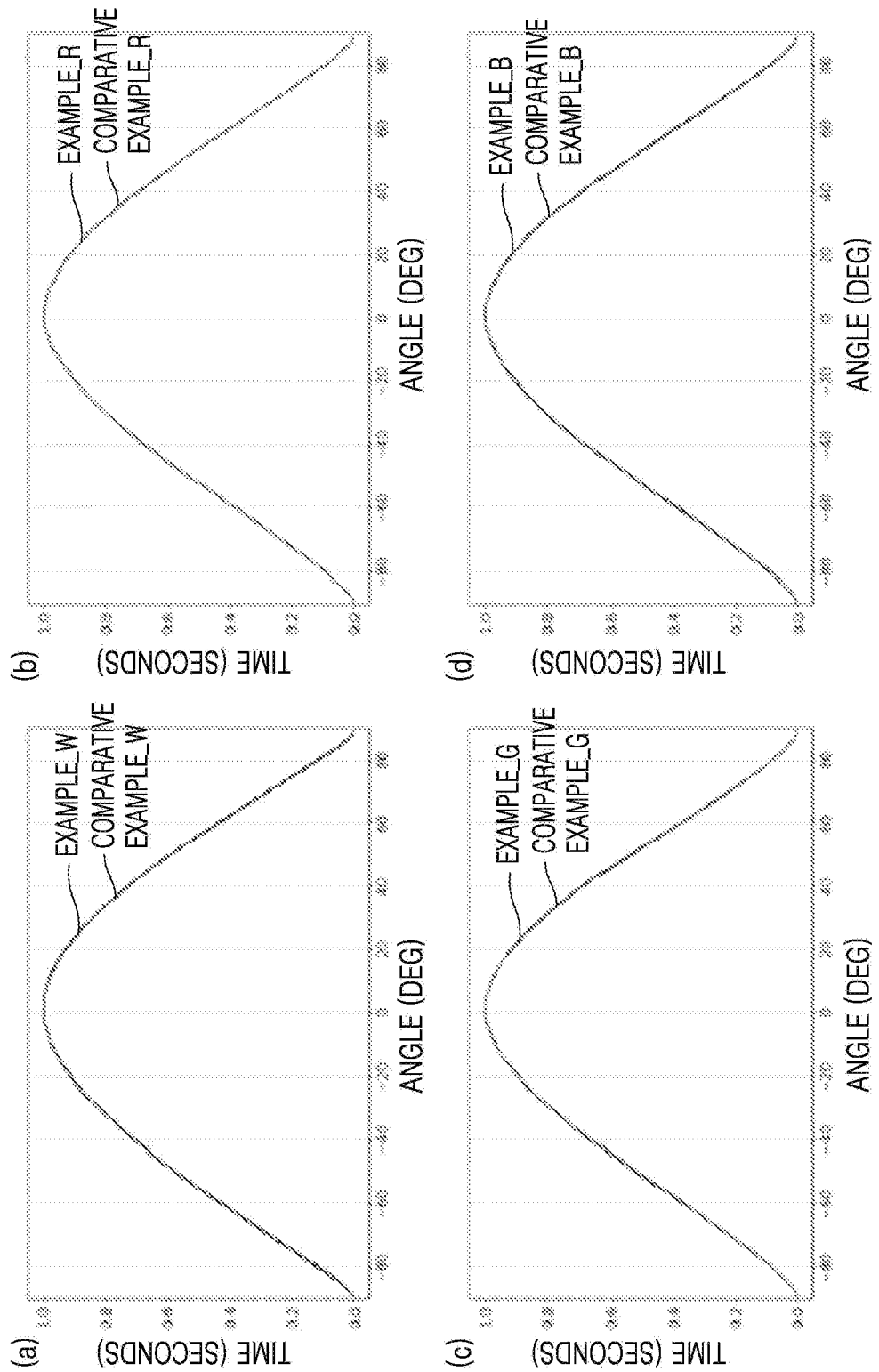
FIG. 8 is a graph showing a viewing angle of each sub-pixel according to Example and Comparative Example of the present disclosure.
Figure 9:
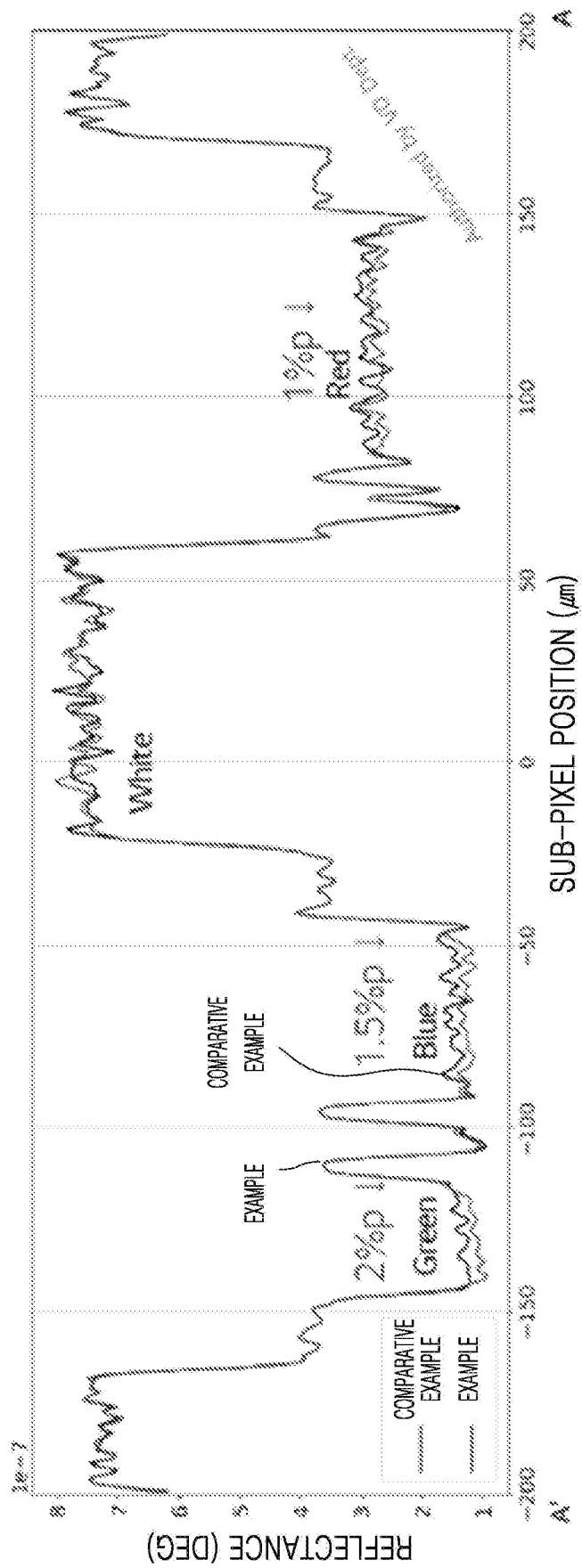
FIG. 9 is a graph showing a reflectance of each sub-pixel according to Example and Comparative Example of the present disclosure.
Figure 10:
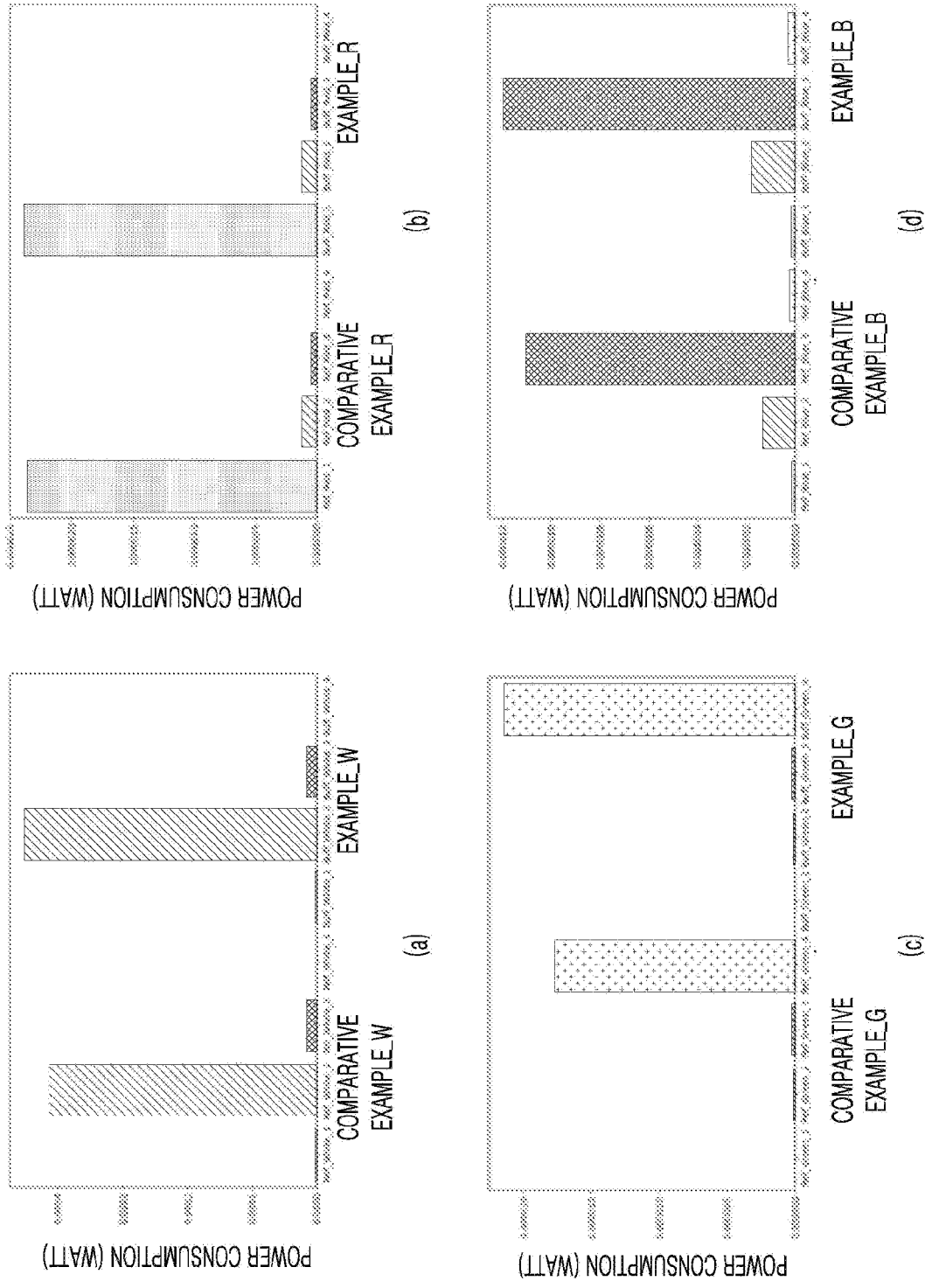
FIG. 10 is a graph showing measured power consumption according to Example and Comparative Example of the present disclosure.

FIG. 7 is a graph showing a transmittance of each sub-pixel according to Example and Comparative Example of the present disclosure. FIG. 8 is a graph showing a viewing angle of each sub-pixel according to Example and Comparative Example of the present disclosure. FIG. 9 is a graph showing a reflectance of each sub-pixel according to Example and Comparative Example of the present disclosure. In addition, FIG. 10 is a graph showing measured power consumption according to Example and Comparative Example of the present disclosure.

Herein, Examples (Example_W, Example_R, Example_G, and Example_B) indicated in FIGS. 7 to 10 are graphs showing the measurements of each sub-pixel of the display device of the present disclosure including the buffer hole 238 defined by removing the buffer layers 220 and 222 in the light-emitting area EA. Further, Comparative Examples (Comparative Example_W, Comparative Example_R, Comparative Example_G, and Comparative Example_B) indicated in FIGS. 7 to 10 are graphs showing the measurements of each sub-pixel of the display device in which the buffer layers 220 and 222 remain in the light-emitting area EA.

Referring to FIG. 7, in comparison of the transmittance during the light emission of each sub-pixel, it may be identified that the transmittance of all of the red pixel (b), the green pixel (c), and the blue pixel (d) are increased by a range from 3.27% to about 6%, as shown in Table [1] below, in the case (Example_R, Example_G, and Example_B) in which the buffer layers 220 and 222 are removed in the light-emitting area EA to define the buffer hole 238 compared to the case (Comparative Example_R, Comparative Example_G, and Comparative Example_B) in which the buffer layers 220 and 222 remain.

It may be identified for the white pixel (a) that the increase percentage of the transmittance in the case (Example_W) in which the buffer layers are removed compared to the case (Comparative Example_W) in which the buffer layers are not removed is 1.09%, which is not significantly different from the increase in the transmittance by at least 3% of the sub-pixels of other colors (red, green, and blue). In this regard, the transmittance is a value representing a luminance value measured from the front (a viewing angle 0 degrees (°)).

TABLE 1

| Sub-pixel | White | Red | Green | Blue |
|---|---|---|---|---|
| Increase percentage (%) | 1.09 | 3.27 | 5.9 | 4.78 |

Further, referring to FIG. 8, which shows a luminance percentage measured at each viewing angle, it may be identified for all of the white pixel ((a) in FIG. 8), the red pixel ((b) in FIG. 8), the green pixel ((c) in FIG. 8), and the blue pixel ((d) in FIG. 8) that there is no change in the luminance percentage at each viewing angle between Example and Comparative Example. Accordingly, even in the case in which the buffer hole 238 is defined by removing the buffer layers 220 and 222 in the light-emitting area EA, as the luminance the same as that exhibited in the case in which the buffer layers 220 and 222 remain, it may be identified that a defect of color change or non-uniformity does not occur at each viewing angle even when the buffer hole 238 is defined.

In addition, referring to FIG. 9, which shows the reflectance when the external light is incident, it may be identified that the reflectance may be reduced in the case in which the buffer layers are removed in the light-emitting area compared to the case in which the buffer layers remain.

Referring back to FIG. 9, when comparing a graph of Example in which the buffer layers are removed in the light-emitting area with a graph of Comparative Example in which the buffer layers remain in the light-emitting area, in a range from a position (0°) in front of the buffer hole 238 to the viewing angle (10°), the reflectance is reduced by 1% in the red pixel, by 1.5% in the blue pixel, and by 2% in the green pixel. Therefore, it may be identified that the reflectance may be reduced by about 1 to 2%. It may be seen that, in the white pixel, almost no difference occurs between the case in which the buffer layers are removed (Example) and the case in which the buffer layers remain (Comparative Example).

As described above, in the display device 20 according to one embodiment of the present disclosure, as the reflectance may be reduced while increasing the transmittance by removing the buffer layers in the light-emitting area, the polarizer introduced to reduce the reflectance may be omitted and the protective layer 300 composed only of the barrier layer 295 and the anti-reflection film 297 may only be introduced. Accordingly, the decrease in the light-emitting efficiency due to the decrease in the transmittance caused by the introduction of the polarizer may be prevented. Further, the increase in the power consumption resulted from the supply of a lot of current to the organic light-emitting element occurring in the case in which the polarizer is introduced may be minimized.

Referring to FIG. 10, which shows total power consumption of the driving transistor of each sub-pixel, when comparing the case in which the buffer layers and the polarizer are removed (Example) with the case in which the buffer layers and the polarizer remain (Comparative Example), the power consumption increased by 10% in the white pixel ((a) in FIG. 10), by 2% in the red pixel ((b) in FIG. 10), by 21% in the green pixel ((c) in FIG. 10), and 9% in the blue pixel ((d) in FIG. 10), but a level of the increase is $10^{-5}$ W, so that the power consumption of the entire display device is not affected.

As described above, according to one embodiment of the present disclosure, as the buffer hole is defined by removing the buffer layers in the light-emitting area, the transmittance of light in the light-emitting area may be improved to increase the luminance and reduce the reflectance. Further, as the buffer layers may be removed to reduce the reflectance, the polarizer may be omitted in the display device, so that the light-emitting efficiency of the organic light-emitting element may be increased. In addition, the non-uniformity of the viewing angle may be prevented from occurring by selectively removing the buffer layer depending on the color of the pixel area.

Hereinafter, a method for manufacturing the display device 20 according to one embodiment of the present disclosure will be described with reference to the drawings.

FIG. 11A to FIG. 18B are cross-sectional views for illustrating a method for manufacturing a display device according to one embodiment of the present disclosure. In this regard, components the same as or similar to those in FIG. 1 to FIG. 2C will be briefly described.

Figure 11A:
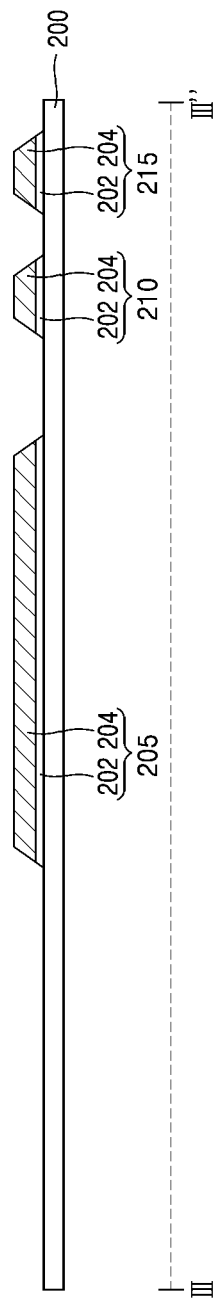
FIG. 11A to in FIG. 18B are cross-sectional views for illustrating a method for manufacturing a display device according to one embodiment of the present disclosure.
Figure 11B:
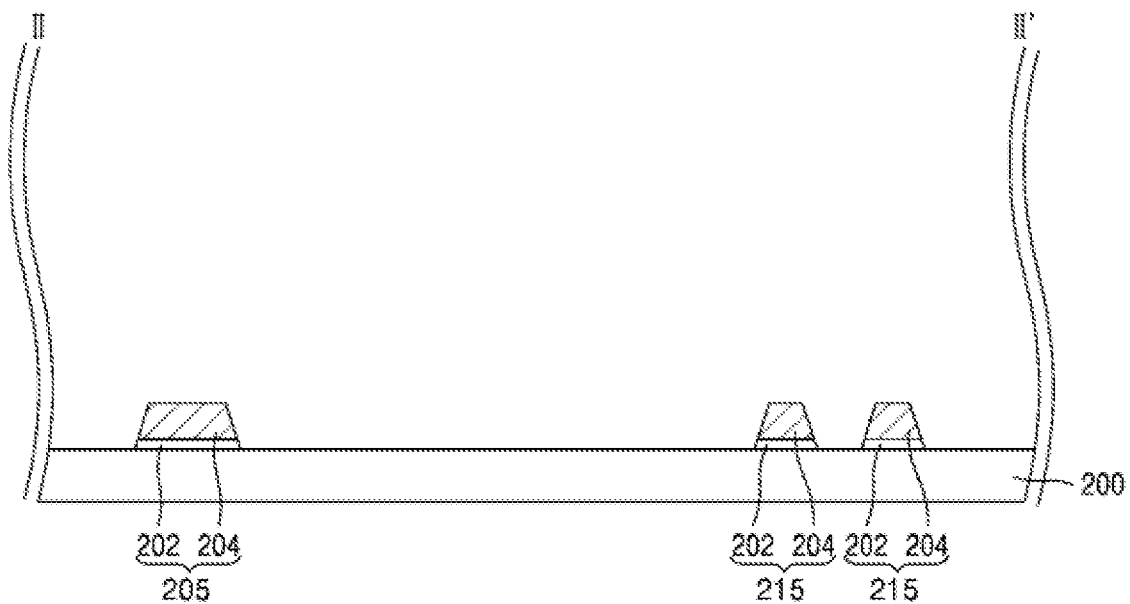

Referring to FIG. 11A and FIG. 11B, the light-blocking layer 205, the first storage electrode 210, and the line electrode 215 are formed on the substrate 200. In this regard, FIG. 11A is a cross-sectional view cut along a direction III-III' in FIG. 1, and FIG. 11B is a cross-sectional view cut along a direction II-II' in FIG. 1. Hereinafter, a description thereof will be omitted.

Specifically, the first metal layer 202 and the second metal layer 204 are formed on the substrate 200. Then, a photolithography process and an etching process using a mask are performed on the first metal layer 202 and the second metal layer 204 to form the light-blocking layer 205, the first storage electrode 210, and the line electrode 215. In this regard, the light-blocking layer 205 is formed at a position overlapping the active layer of the thin-film transistor to be formed later. The light-blocking layer 205 serves to protect the thin-film transistor from the light incident from the outside. The line electrode 215 may be one of the scan line SCAN, the data line DL, and the reference power supply line Vref. In one example, the line electrodes 215 shown in (b) in FIG. 11 may be the first and second data lines DL1 and DL2.

The substrate 200 may be a flat plate made of an insulating material. For example, the substrate 200 may be a light-transmitting substrate. The substrate 200 may be made of a hard material such as glass or tempered glass or made of a flexible plastic material, but the present disclosure may not be limited thereto.

The light-blocking layer 205, the first storage electrode 210, and the line electrode 215 may be formed on the same plane and may be made of the same material. In one example, the first metal layer 202 or the second metal layer 204 may have a single layer or stacked structure of one selected from a group of opaque metal materials consisting of molybdenum (Mo), aluminum (Al), titanium (Ti), and copper (Cu) or an alloy thereof. For example, the first metal layer 202 may be formed to contain the titanium molybdenum alloy (MoTi), and the second metal layer 205 may be formed to contain copper (Cu).

Figure 12A:
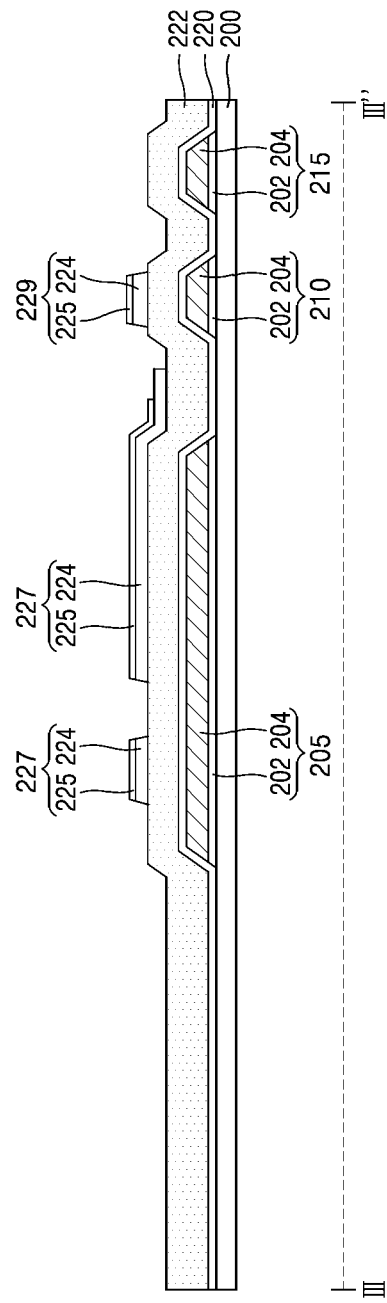
Figure 12B:
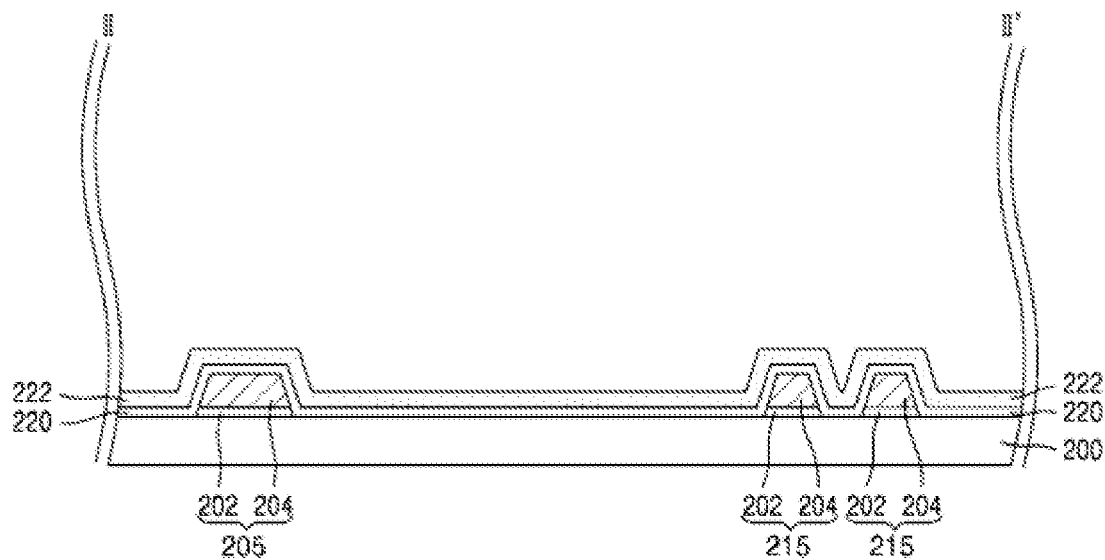

Referring to FIG. 12A and FIG. 12B, the first buffer layer 220 and the second buffer layer 222 are formed on the substrate 200. The first buffer layer 220 and the second buffer layer 222 are formed to cover the light-blocking layer 205, the first storage electrode 210, and the line electrode 215. The first buffer layer 220 and the second buffer layer 222 block the penetration of the moisture or the oxygen from the substrate 200 into the organic light-emitting element to be formed on the substrate 200, and protect the thin-film transistor to be formed in a subsequent process from impurities such as hydrogen leaking from the substrate 200. Further, the first and second buffer layers 220 and 222 serve to insulate the light-blocking layer 205, the first storage electrode 210, and the line electrode 215.

The first buffer layer 220 and the second buffer layer 222 may contain the inorganic insulating material such as the silicon oxide (SiOx) or the silicon nitride (SiNx). In an example, the first buffer layer 220 may be made of the silicon nitride (SiNx) with the first thickness, and the second buffer layer 222 may be made of the silicon oxide (SiOx) with the second thickness that is greater than the first thickness of the first buffer layer 220. The first buffer layer 220 is formed to have the first thickness in a range from 1000 Å to 1500 Å, and the second buffer layer 222 is formed to have the second thickness in a range from 2700 Å to 3300 Å.

Then, an active layer 227 and a second storage electrode 229 are formed on the second buffer layer 222.

To this end, a semiconductor layer 224 and a barrier metal layer 225 are sequentially formed on the second buffer layer 222, and a primary patterning process using a photomask is performed to form each of the active layer 227 and the second storage electrode 229 having a stacked structure of the semiconductor layer 224 and the barrier metal layer 225. Then, the photomask is removed. The semiconductor layer 224 may be formed to contain an amorphous silicon, a polycrystalline silicon, or an oxide semiconductor. The barrier metal layer 225 may be formed to contain the titanium molybdenum (MoTi).

Figure 13A:
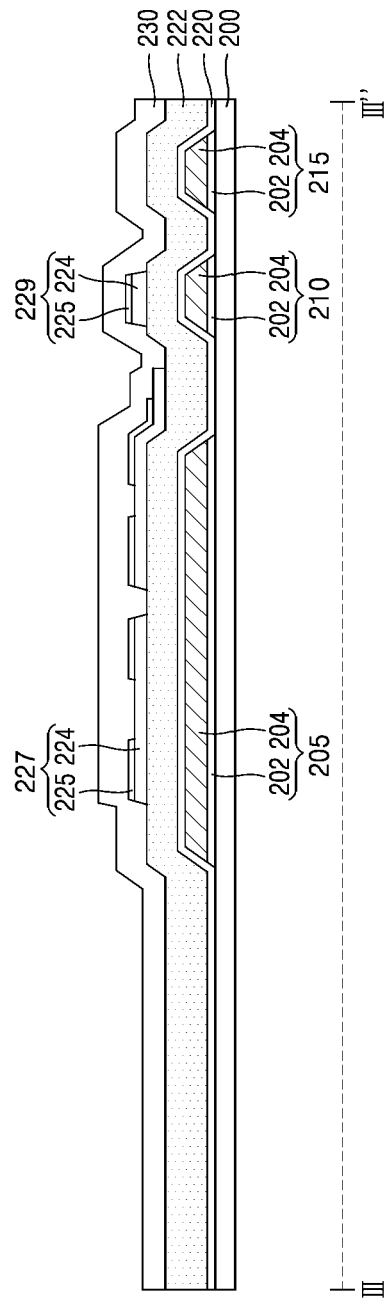
Figure 13B:
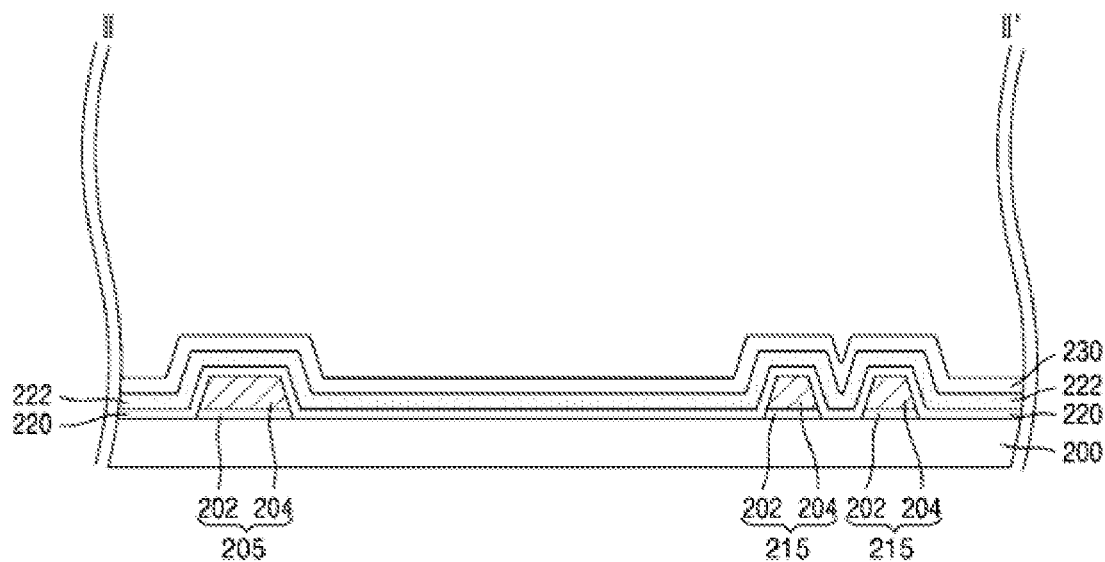

Referring to FIG. 13A and FIG. 13B, the barrier metal layer 225 of the active layer 227 is etched to expose a portion of a surface of the semiconductor layer 224. To this end, only the barrier metal layer 225 is selectively etched and removed by performing a secondary patterning process using the photomask. The secondary patterning process may be performed in a wet etching scheme. The titanium molybdenum (MoTi) serves to prevent copper (Cu) among gate metal materials to be formed later and the semiconductor layer 224 from being directly in contact with each other and reacting with each other. Accordingly, the secondary patterning process may proceed by etching the barrier metal layer 225 so as to expose the portion of the surface of the semiconductor layer 224 excluding a portion to be in contact with the gate metal material.

Subsequently, a gate insulating layer 230 is formed on an entire face of the second buffer layer 222 including the active layer 227. The gate insulating layer 230 may be formed to contain the silicon oxide (SiO2).

Figure 14A:
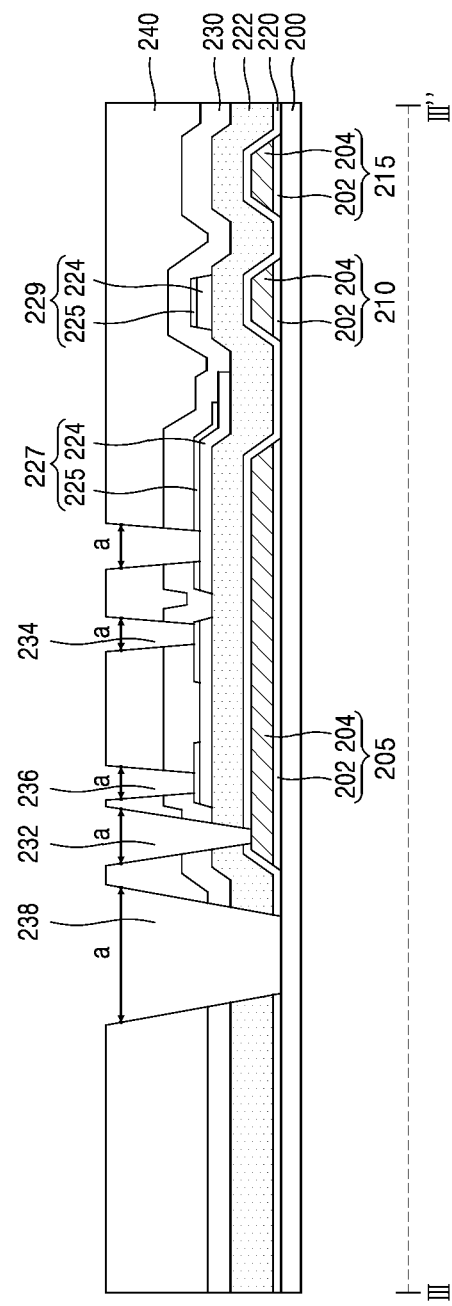
Figure 14B:
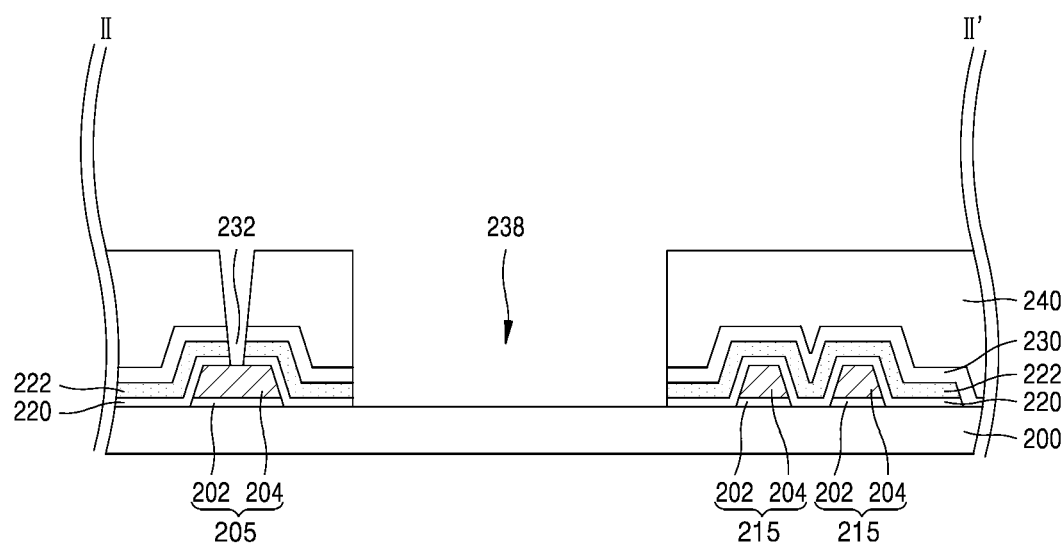

Referring to FIG. 14A and FIG. 14B, a tertiary patterning process for defining a plurality of GI holes 232, 234, 236, and 238 in the gate insulating layer 230 is performed. To this end, a photoresist film is formed on the gate insulating layer 230, and an exposure process and a developing process of removing the photoresist film denatured by the exposure process are performed. Then, a photoresist pattern 240 including a plurality of open areas a in which the photoresist film is entirely removed to expose a surface of the gate insulating layer 230 is formed.

Subsequently, an etching process of removing the gate insulating layer 230 exposed by the open area a is performed. The etching process may be performed in a dry etching scheme. In the process of dry etching, the gate insulating layer 230 exposed in the open area a of the photoresist pattern 240, and the second buffer layer 222 and the first buffer layer 220 below the gate insulating layer 230 may be etched together and removed. Then, the plurality of GI holes 232, 234, 236, and 238 are defined in the gate insulating layer 230.

In this regard, the plurality of GI holes 232, 234, 236, and 238 may include a buffer hole 238 that exposes a surface of the substrate 200 as the buffer layers 220 and 222 are entirely removed in the portion where the light-emitting area EA is to be formed, and a light-blocking contact hole 232 defined by exposing a surface of the light-blocking layer 205. In addition, the plurality of GI holes 232, 234, 236, and 238 may include a source contact hole 234 and a drain contact hole 236 that expose a surface of the barrier metal layer 225 of the active layer 227. In addition, the photoresist pattern 240 is removed by performing the strip process.

Figure 15A:
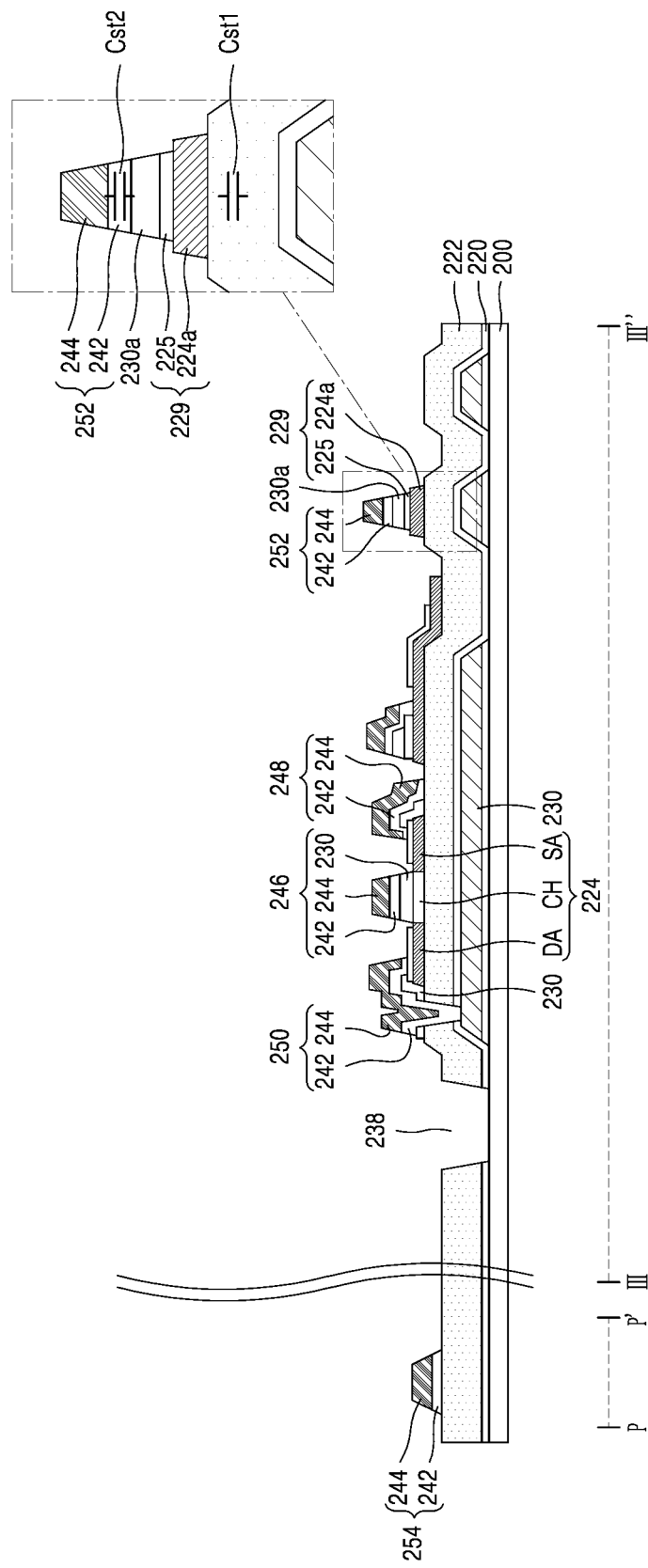
Figure 15B:
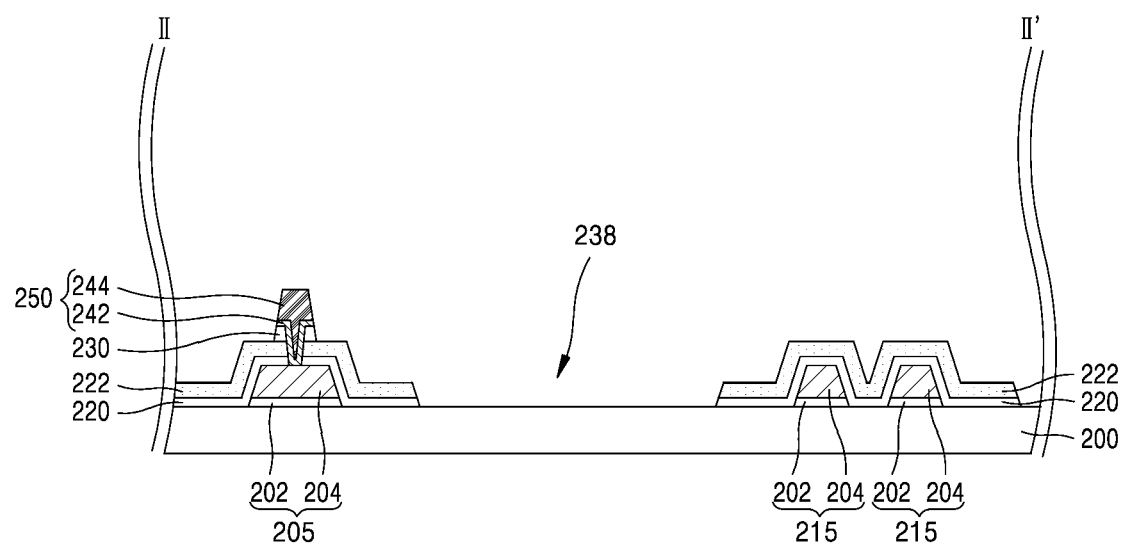

Referring to FIG. 15A and FIG. 15B, the gate electrode 246, a source electrode 248, a drain electrode 250, a third storage electrode 252, and a pad electrode 254 are formed on the substrate 200.

To this end, the gate metal layers 242 and 244 are formed on the substrate 200 on which the gate insulating layer 230 having the plurality of GI holes 232, 234, and 236 defined therein is formed. The gate metal layers 242 and 244 may be formed in a structure in which the first gate metal layer 242 and the second gate metal layer 244 are stacked. In one example, each of the first gate metal layer 242 and the second gate metal layer 244 may have a single layer or multiple layers made of one selected from a group consisting of molybdenum (Mo), aluminum (Al), chromium (Cr), gold (Au), titanium (Ti), nickel (Ni), neodymium (Nd), and copper (Cu) or an alloy thereof, but the present disclosure may not be limited thereto.

Then, the gate metal layers 242 and 244 and the gate insulating layer 230 are patterned via the photolithography process and the etching process using the photomask to form the gate electrode 246, the source electrode 248, the drain electrode 250, the third storage electrode 252, and the pad electrode 254. In this regard, the etching process may be performed in the dry etching scheme. The gate electrode 246, the source electrode 248, the drain electrode 250, the third storage electrode 252, and the pad electrode 254 are formed by patterning the same gate metal layers 242 and 244, so that the gate electrode 246, the source electrode 248, the drain electrode 250, the third storage electrode 252, and the pad electrode 254 may be made of the same material and may be formed on the same planar layer.

In one example, in the process of dry etching for forming the gate electrode 246, the semiconductor layer 224 of the active layer 227 and the semiconductor layer 224 of the second storage electrode 229 may become conductive. Specifically, when the semiconductor layer 224 of the active layer 227 and the semiconductor layer 224 of the second storage electrode 229 are made of an oxide semiconductor, conductivity characteristics varies based on an oxygen content. When the dry etching process is performed, the oxygen content in the oxide semiconductor is reduced, so that the oxide semiconductor may become conductive as a resistance thereof is lowered. Accordingly, an etching gas applied in the dry etching comes into contact with the semiconductor layer 224 of the exposed active layer 227 and the second storage electrode 229 and the semiconductor layer 224 becomes conductive, so that a conductive area may be formed.

The conductive area may include a source area SA, a drain area DA, and a semiconductor layer 224a of the second storage electrode 229. In addition, a channel area CH may be disposed in the semiconductor layer 224 beneath the gate electrode 246 in which the conductive area is not formed.

As the semiconductor layer 224a of the second storage electrode 229 becomes conductive, a first storage capacitor Cst1 formed by overlapping the first storage electrode 210 and the second storage electrode 229 with the first buffer layer 220 and the second buffer layer 222 interposed therebetween, and a second storage capacitor Cst2 formed by overlapping the second storage electrode 229 and the third storage electrode 252 with the gate insulating layer 230 interposed therebetween are formed.

Figure 16A:
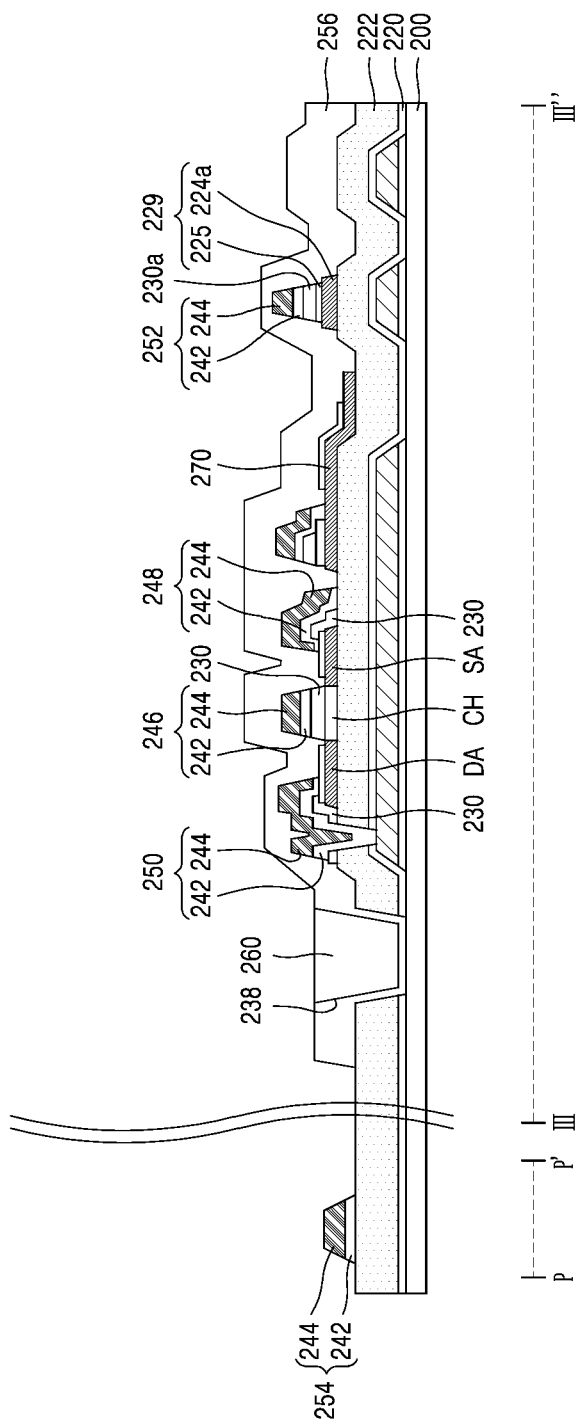
Figure 16B:
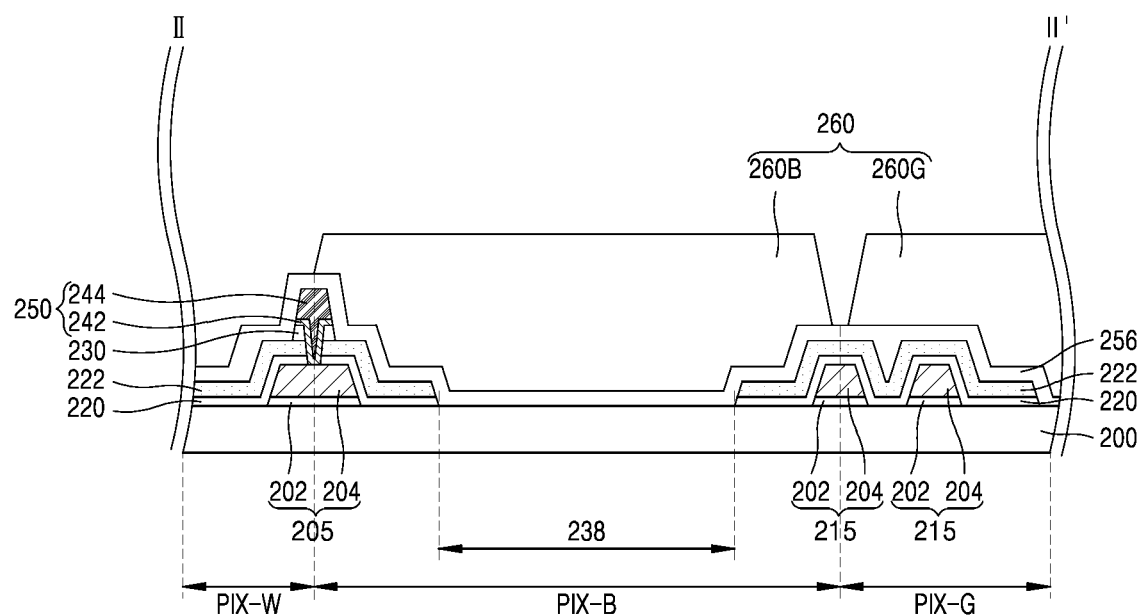

Referring to FIG. 16A and FIG. 16B, the interlayer insulating film 256 is formed on the substrate 200 on which the gate electrode 246, the third storage electrode 252, the pad electrode 254, and the like are formed. The interlayer insulating film 256 is formed to have a sufficient thickness to cover all the surfaces of the gate electrode 246, the source/drain electrodes 248 and 250, and the third storage electrode 252. The interlayer insulating film 256 may be made of the inorganic insulating material such as the silicon nitride (SiNx) or the silicon oxide (SiOx). The interlayer insulating film 256 may be formed along an exposed face of the buffer hole 238.

Then, the color filter 260 filling the buffer hole 238 is formed on the interlayer insulating film 256. To this end, a red R pigment (not shown), a green pigment 260G, and a blue pigment 260B are applied on the interlayer insulating film 256 and are subjected to a mask process to form the color filter 260 to correspond to the light-emitting area. When the sub-pixels are composed of the red pixel PIX_R, the white pixel PIX_W, the blue pixel PIX_B, and the green pixel PIX_G, at least three mask processes may be required. In this regard, referring to FIG. 1 and FIG. 16B, the area where the white pixel PIX_W will be formed is covered with the first buffer layer 220 and the second buffer layer 222 on the substrate 200, and the areas where the red pixel PIX_R, the blue pixel PIX_B, and the green pixel PIX_G will be respectively formed are covered with the interlayer insulating film 256 on the substrate 200 exposed by the buffer hole 238 defined by removing the first buffer layer 220 and the second buffer layer 222.

Figure 17A:
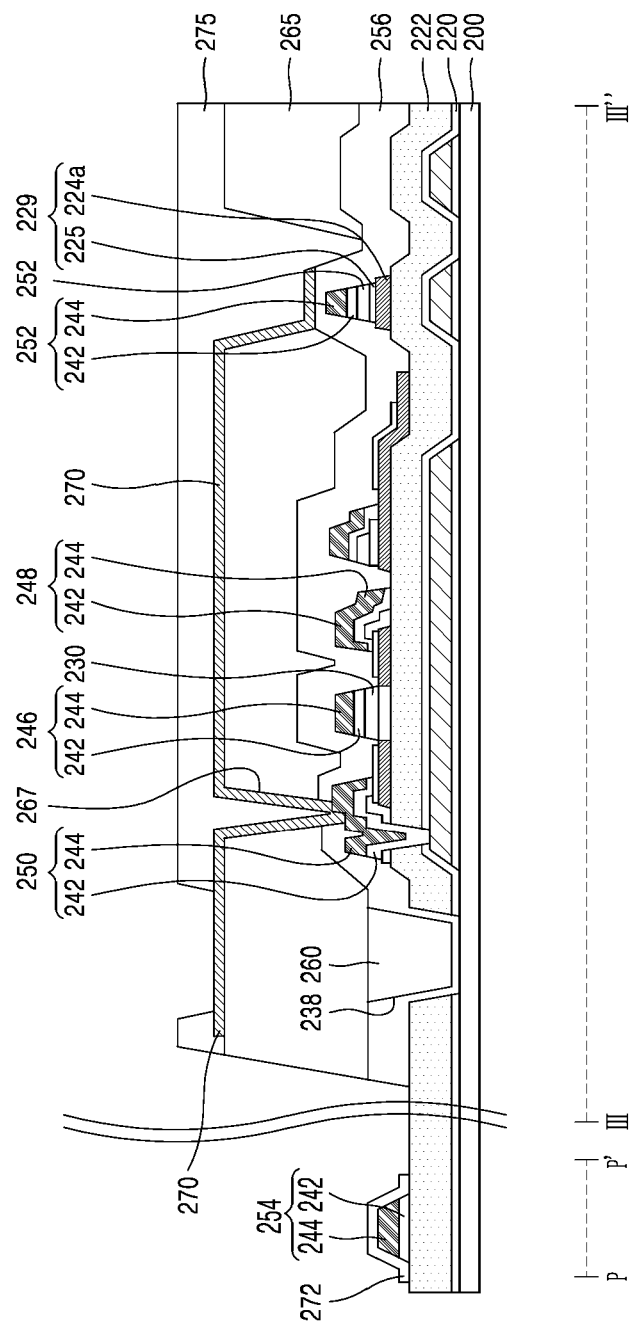
Figure 17B:
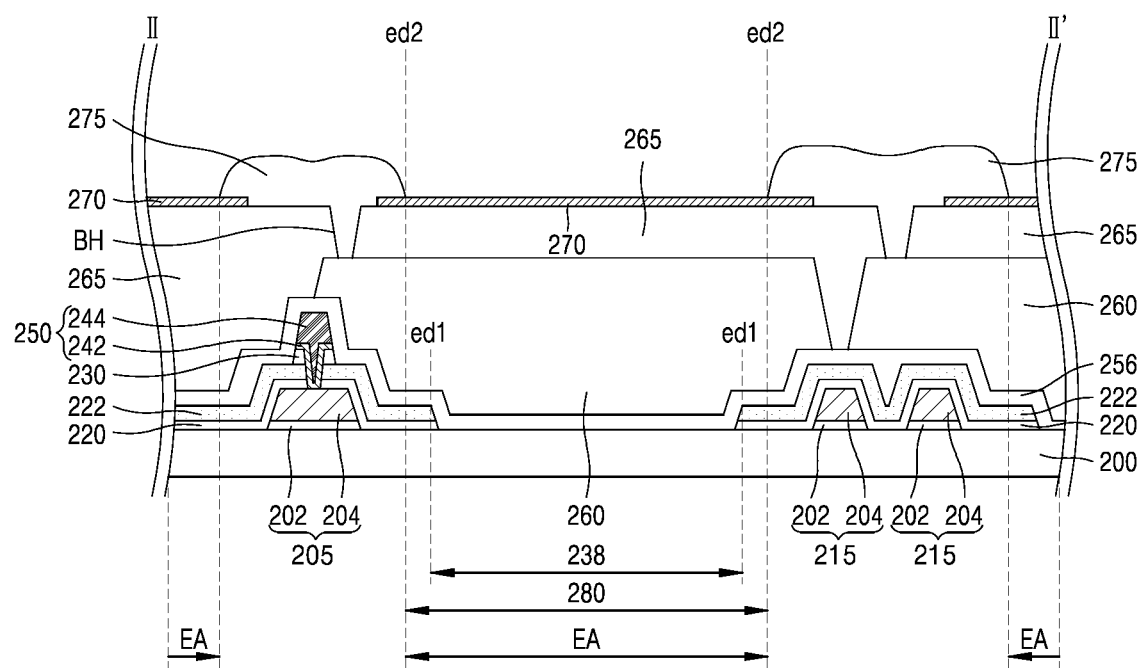

Referring to FIG. 17A and FIG. 17B, the planarization film 265 is formed on the interlayer insulating film 256 on which the color filter 260 is disposed.

The planarization film 265 may be formed to have a sufficient thickness to planarize the surface of the substrate 200 while protecting the elements below. The planarization film 265 may be formed by applying a transparent organic insulating material. In one example, the planarization film 265 may contain the acrylic resin. Referring to FIG. 17B, the planarization film 265 may include the boundary hole BH at the boundary for separating one sub-pixel from the adjacent sub-pixel. The boundary hole BH serves to prevent the light leakage from one sub-pixel to another adjacent sub-pixel.

Subsequently, the planarization film 265 and the interlayer insulating film 256 are patterned to define a pixel contact hole 267 that exposes a portion of a surface of the drain electrode 250.

Then, the first electrode 270 is formed on the planarization film 265, and the bank 275 having the bank hole 280 defined therein that exposes a portion of a surface of the first electrode 270 is formed.

The first electrode 270 may be electrically connected to the gate electrode 246 via the drain electrode 250 exposed by the pixel contact hole 267. The first electrode 270 may be made of the transparent metal oxide such as the indium-tin-oxide (ITO) or the indium-zinc-oxide (IZO). The first electrode 270 may be referred to as the anode electrode or the pixel electrode. The first electrode 270 may be formed as a pad cover electrode 272 that prevents corrosion of the pad electrode 254 by covering an exposed face of the pad electrode 254 disposed in the pad area P-P'.

The bank 275 as the boundary area for defining the light-emitting area EA of the area in which the pixel is to be formed serves to separate the sub-pixels PIX_R, PIX_W, PIX_B, and PIX_G from each other. Further, the bank 275 serves as the barrier that prevents the light of the different colors of the adjacent sub-pixels from being mixed with each other and output. In one example, the bank 275 may be formed to extend on the surface of the planarization film 265 while entirely filling the boundary hole BH. As the boundary hole BH is filled with the bank 275, the light may be prevented from leaking from one sub-pixel to another adjacent sub-pixel via the planarization film 265.

It is preferable that the size of the buffer hole 238 according to an embodiment of the present disclosure is at least equal to or smaller than the size of the bank hole 280. In other words, in the cross-sectional view, it is preferable that both ends ed1 of the buffer layers 220 and 222 may have the size at least equal to the size of both ends ed2 of the bank 275 or may further extends than the both ends ed2 of the bank 275 to have the size greater than that of the ends ed2 of the bank 275.

When the both ends ed1 of the buffer layers 220 and 222 are formed smaller than the both ends ed2 of the bank 275, the light propagates along the interface between the buffer layers 220 and 222, and is introduced to the transistor by increasing reflection on the metal material by the refractive index of the first buffer layer 220 containing the silicon nitride (SiNx) among the buffer layers 220 and 222, thereby easily reaching the active layer of the transistor. The light that has reached the active layer of the transistor may increase the negative bias stress of the transistor, thereby degrading NBTiS characteristics. Accordingly, in order to reduce the interfacial effect via the etched cross-sections, the end ed1 of the buffer layers 220 and 222 is formed larger than the end ed2 of the bank 275.

Accordingly, the edge of the buffer layers 220 and 222 including the buffer hole 238 defined therein has the size at least equal to the size of the edge of the bank 275 including the buffer hole 280 defined therein, or further extends than the edge of the bank 275 to have the size greater than that of the edge of the bank 275. In this regard, the buffer hole 238 may have the rectangular shape surrounding the four sides of each of the sub-pixels PLX_R, PIX_W, PIX_B, and PIX_G as shown in FIG. 3.

The bank 275 may be made of the inorganic insulating material such as the silicon nitride (SiNx), the silicon oxide (SiOx), or the organic insulating material such as the polyimide.

The bank 275 may be formed in an area excluding the pad area P-P' so as not to cover the pad electrode 254 covered with the pad cover electrode 272.

Figure 18A:
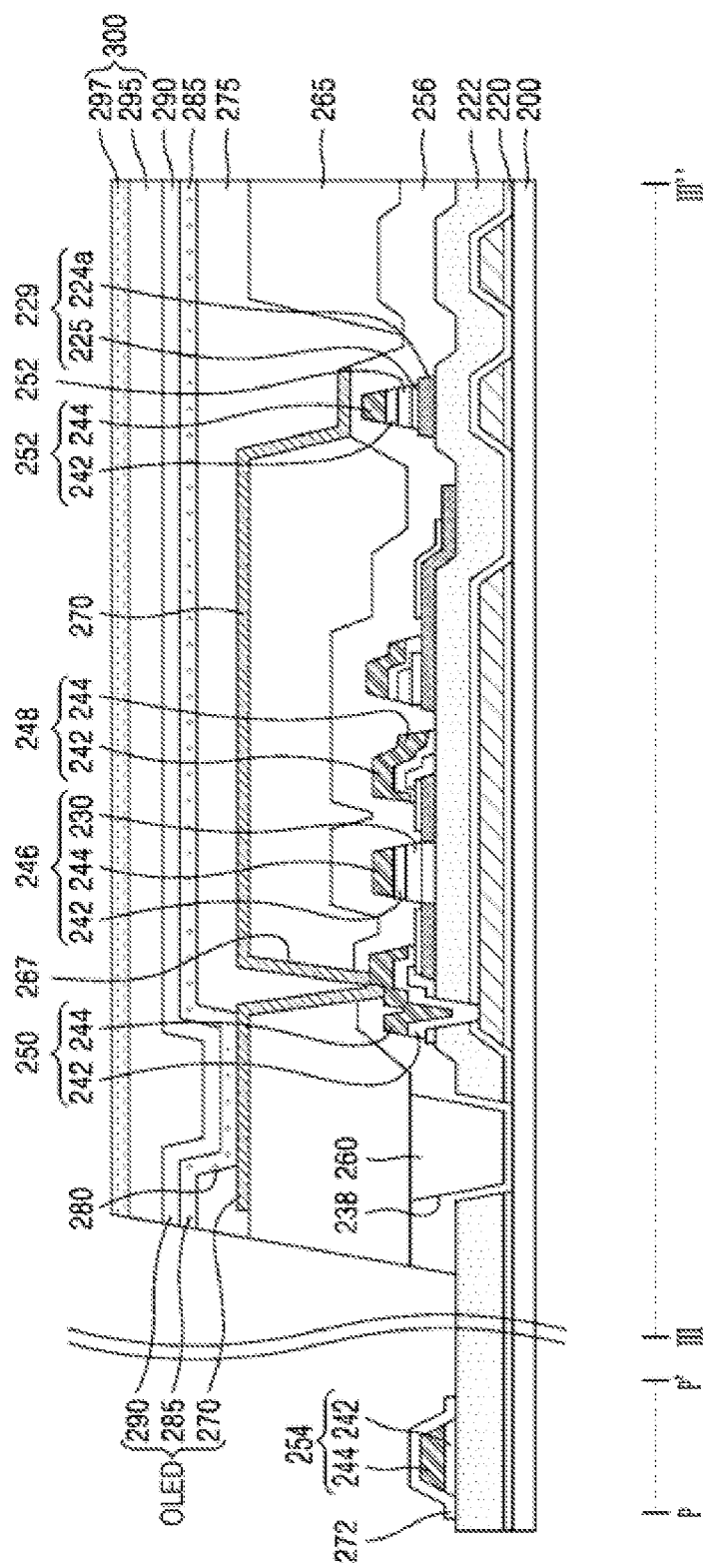
Figure 18B:
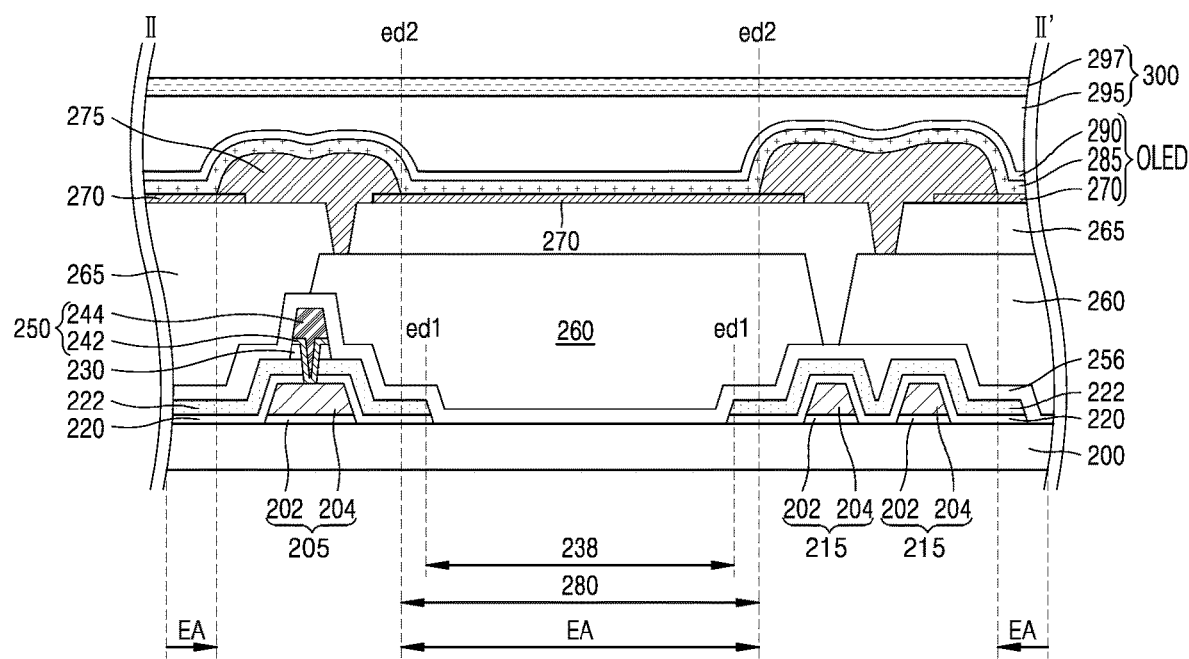

Referring to FIG. 18A and FIG. 18B, the organic light-emitting layer 285 and the second electrode 290 are formed on the light-emitting area defined by the bank 275. Accordingly, the organic light-emitting element (OLED) composed of the first electrode 270, the organic light-emitting layer 285, and the second electrode 290 may be constructed. The organic light-emitting layer 285 and the second electrode 290 may be formed in the remaining area excluding the pad area P-P'.

The organic light-emitting layer 285 is formed to be in direct contact with the first electrode 270 exposed by the bank hole 280. In one example, the organic light-emitting layer 285 may be formed to extend on a top face of the bank 275 along the exposed face of the first electrode 270. In an example, the organic light-emitting layer 285 may be made of the organic material emitting the white light, and may exhibit the color set by the color filter 260.

Although not shown in the drawing, the organic light-emitting layer 285 may include a stacked structure of a hole transport layer HTL, a light-emitting layer EML and an electron transport layer ETL. The organic light-emitting layer may further include a hole blocking layer HBL, a hole injection layer HIL, an electron blocking layer EBL and an electron injection layer EIL together with the hole transport layer HTL, the light-emitting layer EML, and the electron transport layer ETL.

The second electrode 290 may be formed to cover the entirety of the exposed face of the organic light-emitting layer 285. The second electrode 290 may be formed as a common electrode that applies a voltage while in common contact with adjacent pixels on the display area. The second electrode 290 may be referred to as the cathode electrode. In an example, the second electrode 290 may contain the transparent metal oxide such as the indium-tin-oxide (ITO) or the indium-zinc-oxide (IZO).

In addition, the protective layer 300 may be disposed on the second electrode 290. The protective layer 300 may include the barrier layer 295 and the anti-reflection film 297 for preventing the moisture or the oxygen from penetrating into the organic light-emitting layer 285. The barrier layer 295 may be made of the material having the low moisture permeability, such as the polymer material, and the anti-reflection film 297 may include the acrylic film.

As the buffer layers are removed in the light-emitting area EA of each of the sub-pixels except for the white pixel, the transmittance increases while the reflectance on the external light decreases. Accordingly, because the polarizer introduced to lower the reflectance while constructing the protective layer may be omitted, the protective layer 300 may have the double structure of the barrier layer 295 and the anti-reflection film 297.

As described above, the display device according to embodiments of the present disclosure may define the buffer hole by selectively removing the buffer layers in the light-emitting area of each sub-pixel in order to increase the transmittance. Accordingly, the light extraction efficiency of the display device may be improved by reducing the reflectance resulted from the refractive index of the buffer layer to reduce the reflectance in the light-emitting area. Further, the buffer hole may be defined to have the size smaller than that of the bank hole to prevent the external light from being introduced into the transistor.

It will be apparent to those skilled in the art that various modifications and variations can be made in the display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A display device comprising:
   a substrate including a plurality of sub-pixels;
   a light-emitting area included in each of the sub-pixels;
   a buffer layer positioned on the substrate and including each buffer hole defined therein for exposing a surface of the substrate in each light-emitting area; and
   a bank positioned on the buffer layer and having each bank hole defined therein for separating the light-emitting area of each sub-pixel from the light-emitting areas of other sub-pixels.

2. The display device of claim 1, further comprising:
   a first electrode positioned on the light-emitting area;
   an organic light-emitting layer in contact with the first electrode;
   a second electrode positioned on the organic light-emitting layer; and
   a protective layer positioned on the second electrode, wherein the protective layer is composed of a double structure of a barrier layer and an anti-reflection film.

3. The display device of claim 1, wherein the plurality of sub-pixels include a red pixel, a blue pixel, a green pixel, and a white pixel,
   wherein the buffer hole is positioned on each of the light-emitting areas of the red pixel, the blue pixel, and the green pixel.

4. The display device of claim 3, wherein the white pixel further includes a buffer layer positioned on the light-emitting area thereof.

5. The display device of claim 1, wherein the buffer hole has a size at least equal to or smaller than a size of the bank hole.

6. The display device of claim 1, wherein an edge of the buffer layer including the buffer hole defined therein has a size at least equal to a size of an edge of the bank including the bank hole defined therein or further extends than the edge of the bank to have a size greater than the size of the edge of the bank.

7. The display device of claim 1, wherein the buffer hole has a rectangular shape surrounding four sides of each of the plurality of sub-pixels.

8. The display device of claim 1, further comprising:
   a light-shielding area positioned outside of the light-emitting area on the substrate,
   wherein the buffer layer includes a first part and a second part, the first part disposed over the light-emitting area and the second part disposed over the light-shielding area, and
   wherein the buffer hole is disposed through the buffer layer of the first part for exposing a surface of the substrate in each light-emitting area.

9. A display device comprising:
   a substrate including a plurality of sub-pixels;
   a buffer layer positioned on the substrate;
   a buffer hole defined to extend through the buffer layer so as to expose the substrate;
   an interlayer insulating film for covering the substrate exposed by each buffer hole;
   a color filter positioned on the interlayer insulating film and filling each buffer hole;
   a planarization film positioned on the color filter;
   a first electrode positioned on the planarization film; and
   a bank positioned on the first electrode and having each bank hole defined therein for separating a light-emitting area of one sub-pixel from light-emitting areas of other sub-pixels.

10. The display device of claim 9, further comprising:
    an organic light-emitting layer in contact with the first electrode exposed by each bank hole;
    a second electrode positioned on the organic light-emitting layer; and
    a protective layer positioned on the second electrode, wherein the protective layer is composed of a double structure of a barrier layer and an anti-reflection film.

11. The display device of claim 9, wherein the buffer hole has a size at least equal to or smaller than a size of the bank hole.

12. The display device of claim 9, wherein an edge of the buffer layer including the buffer hole defined therein has a size at least equal to a size of an edge of the bank including the bank hole defined therein or further extends than the edge of the bank to have a size greater than the size of the edge of the bank.

13. The display device of claim 9, wherein the buffer hole has a rectangular shape surrounding four sides of each of the plurality of sub-pixels.

14. The display device of claim 9, wherein the plurality of sub-pixels include a red pixel, a blue pixel, a green pixel, and a white pixel,
    wherein the buffer hole is positioned on each of the light-emitting areas of the red pixel, the blue pixel, and the green pixel, wherein the buffer hole is covered by the buffer layer in the light-emitting area of the white pixel.

* * * * *